United States Patent [19]
Kitani et al.

[11] Patent Number: 5,198,685
[45] Date of Patent: Mar. 30, 1993

[54] PHOTOELECTRIC CONVERSION APPARATUS WITH SHOCK-ABSORBING LAYER

[75] Inventors: Masashi Kitani, Yokohama; Hisanori Tsuda, Atsugi; Katsunori Terada, Sagamihara; Satoshi Itabashi, Chigasaki; Tetsuya Shimada, Zama, all of Japan

[73] Assignee: Canon Kabushiki Kaisha, Tokyo, Japan

[21] Appl. No.: 737,323

[22] Filed: Jul. 29, 1991

[30] Foreign Application Priority Data

Aug. 1, 1990 [JP] Japan .................................. 2-202380
Aug. 3, 1990 [JP] Japan .................................. 2-206598

[51] Int. Cl.$^5$ ........................................... H01L 27/14
[52] U.S. Cl. .................................... 257/82; 257/447; 257/460; 257/436; 257/433
[58] Field of Search ............... 357/30 G, 30 H, 30 I, 357/30 K, 30 R, 54, 8, 32, 30 S, 30 D, 30 P, 30 PF, 52, 52 C, 54 N, 54 R, 54 G, 54 A, 54 M, 54 S, 19

[56] References Cited

U.S. PATENT DOCUMENTS

| | | | |
|---|---|---|---|
| 4,723,129 | 2/1988 | Endo et al. | 346/1.1 |
| 4,740,796 | 4/1988 | Endo et al. | 346/1.1 |
| 4,924,282 | 5/1990 | Komiyama et al. | 357/30 K |
| 5,017,988 | 5/1991 | Komiyama et al. | 357/32 X |
| 5,060,040 | 10/1991 | Saika et al. | 357/30 K |

FOREIGN PATENT DOCUMENTS 56-167333 12/1981 Japan .................. 357/54 R
1-128578 5/1989 Japan .

OTHER PUBLICATIONS

Mukai et al., "Planar Multilevel Interconnection Technology Employing Polyimide," *IEEE Journal of Solid-State Circuits*, vol. SC-13, No. 4, Aug. 1978, pp. 462–467.

*Nikkei Electronics*, pp. 207–211, Nov. 16, 1987 (No. 434), "How to Improve Reliability of Close-Contact Image Sensors", Sakamaki et al.

*Primary Examiner*—William Mintel
*Attorney, Agent, or Firm*—Fitzpatrick, Cella, Harper & Scinto

[57] ABSTRACT

A photoelectric conversion apparatus having a thin plate glass wear-resisting layer is formed on photoelectric conversion devices, drive circuit and signal lines. An original document is disposed on the wear-resisting layer to confront the photoelectric conversion devices. Light is emitted from a light source disposed to confront the light transmissive substrate on the side opposing the original document, transmitted through a light transmissive substrate and applied to the original document. Reflected light from the original document is received by the photoelectric conversion devices so that electric signals transmitted from the photoelectric conversion devices can be read out through the signal lines. A protection layer is made of an inorganic thin film and formed on at least the photoelectric conversion devices, the drive circuit and the signal lines; a shock-absorbing layer made of an organic film is disposed at least between an end portion of the wear-resisting layer and the light transmissive substrate.

20 Claims, 14 Drawing Sheets

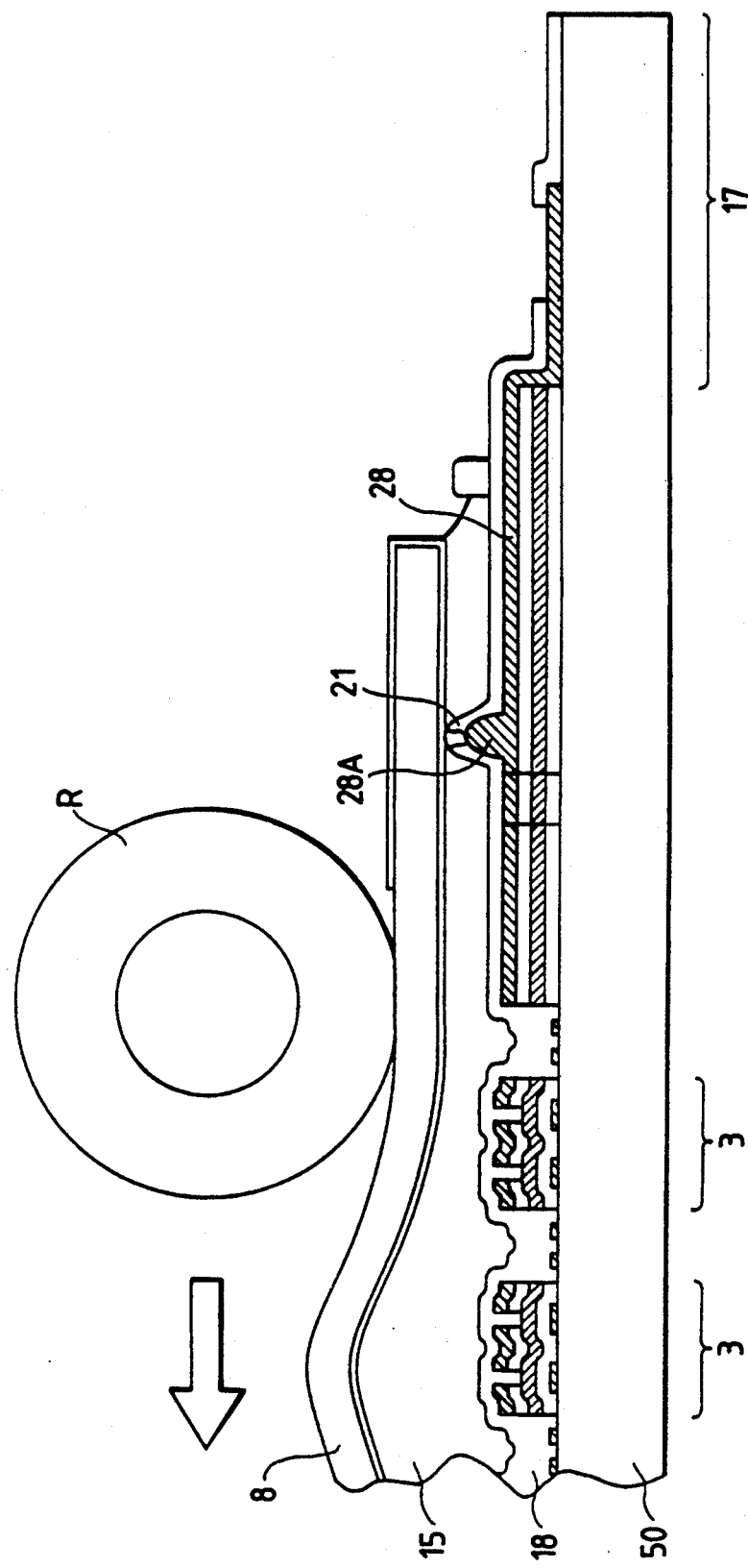

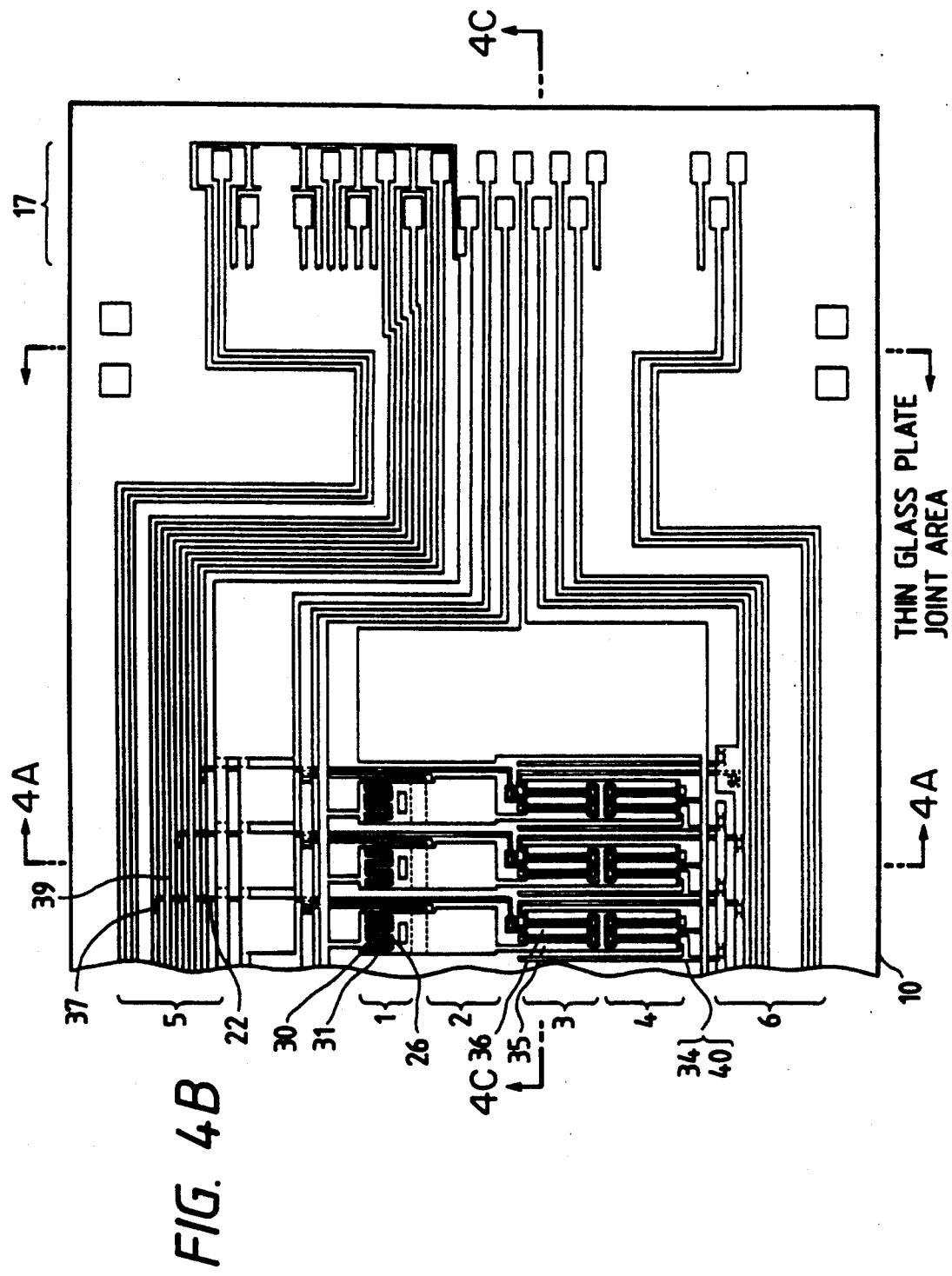

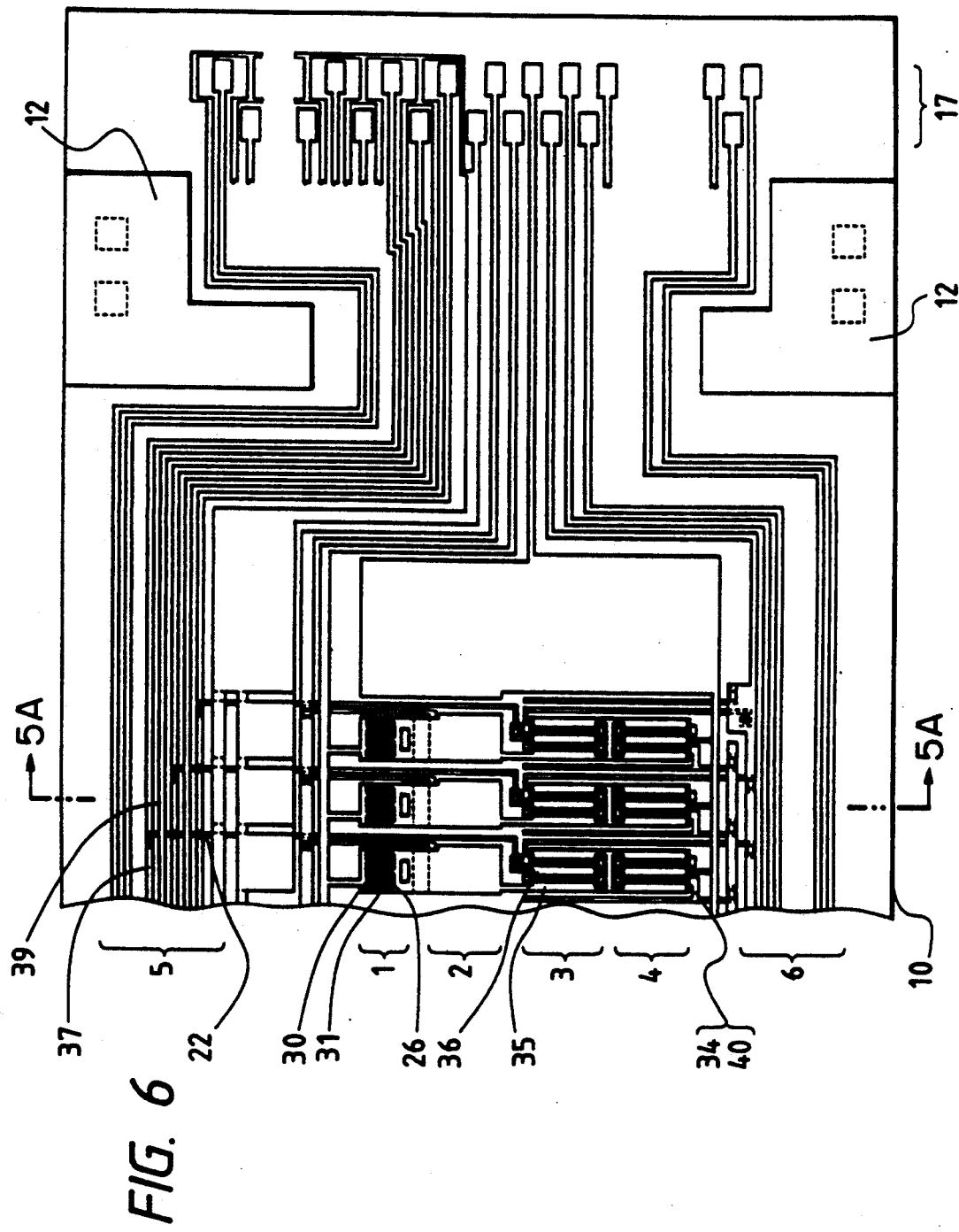

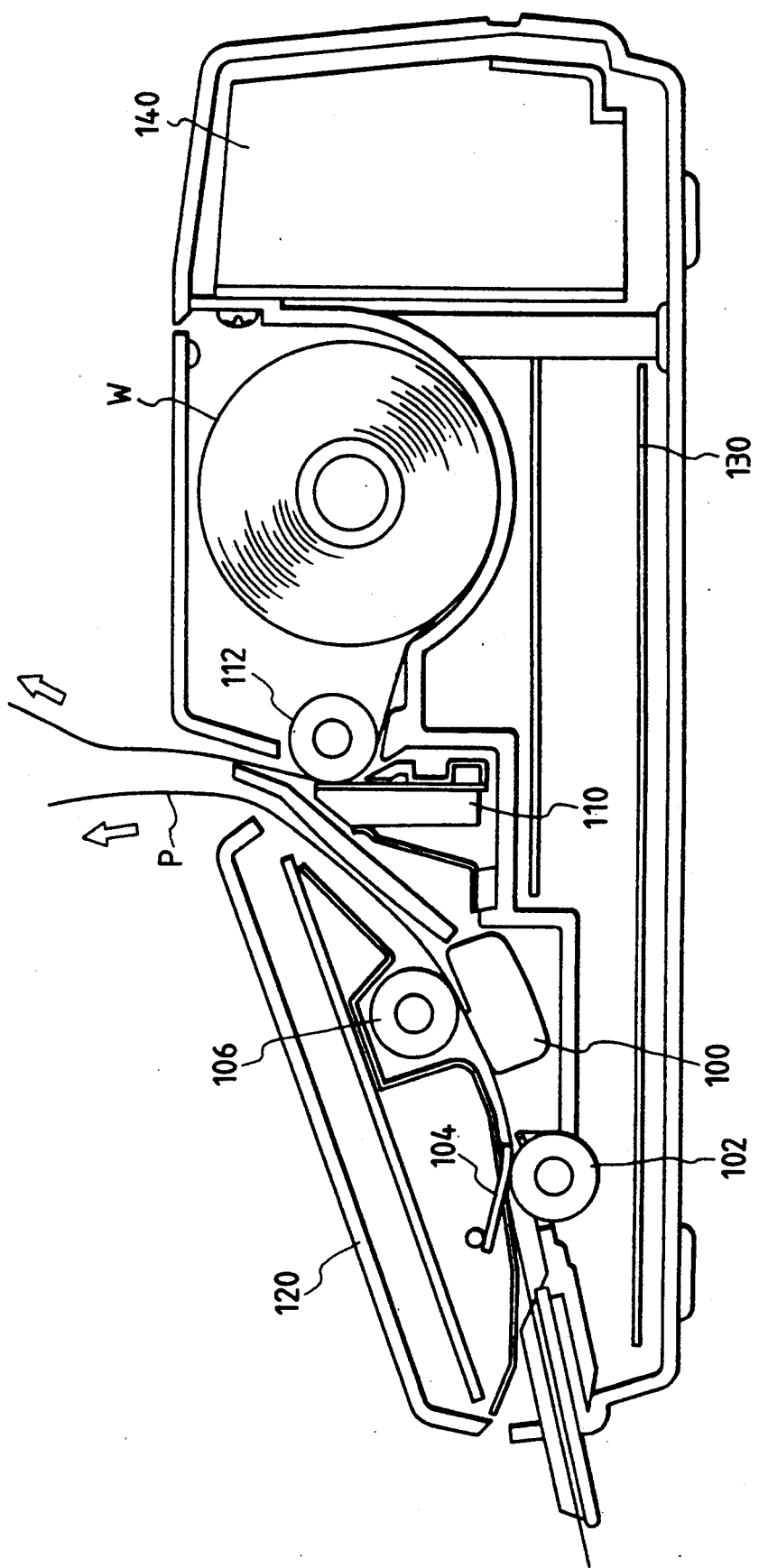

PHOTOELECTRIC CONVERSION APPARATUS WITH SHOCK-ABSORBING LAYER

BACKGROUND OF THE INVENTION

1. Field of the Invention

The present invention relates to a photoelectric conversion apparatus, and, more particularly, to a photoelectric conversion apparatus for use in an input portion of an information processing apparatus such as a facsimile machine, an image reader, a digital copying machine and an electronic blackboard or the like in which image information formed on the original document is read out by relatively moving the original document while closely bringing the original document into contact with a portion above a one-dimensional line sensor.

2. Related Background Art

Recently, an elongated line sensor having an equal-magnification optical system as a photoelectric conversion apparatus has been developed in order to reduce the overall size of a facscimile machine, an image reader and the like and to improve the performance of the same. Furthermore, in order to reduce the overall size and cost, there has been developed a photoelectric conversion apparatus of the type arranged in such a manner that the equal-magnification fiber lens array is omitted from the structure and light reflected from the original document is directly detected by a sensor via a transparent spacer such as a thin plate glass.

FIGS. 1A and 1B respectively are schematic views which illustrate a photoelectric conversion apparatus of the type described above disclosed by a group including the inventor of the present invention in "Nikkei Electronics" p.p 207 to 221, Nov. 16, 1987 (No. 434) and that disclosed in U.S. Pat. No. 4,924,282.

FIG. 1A is a schematic cross sectional view of a photoelectric device array for a conventional photoelectric conversion apparatus when viewed from the main scanning direction. FIG. 1B is a schematic plan view of the photoelectric conversion device array when viewed from the original document. FIG. 1A is a cross sectional view taken along line A—A' of FIG. 1B.

The conventional photoelectric conversion apparatus has been arranged in such a manner that a-Si:H (amorphous silicone hydride) is used to, by a simple process, integrally form, on a light transmissive insulating substrate 10, a photoelectric conversion device portion 1, a registering capacitor portion 2, TFT (Thin Film Transistor) portions 3 and 4, a matrix signal circuit portion 5 and a gate drive circuit portion 6.

On the insulating substrate 10, there are formed a first conductive layer 24 made of Cr, an insulating layer 25 made of SiN, a photoconductive semiconductor layer 26 made of a-Si:H, an ohmic contact layer 27 made of n+a-Si:H and a second conductive layer 28 made of Al.

On the second conductive layer 28, there are, via an adhesive layer 9 and an electrostatic shielding layer 15 made of a light transmissive conductive material such as ITO, formed: a passivation layer 18 made of an organic material such as polyimide containing impurity ions in an extremely small quantity for the purpose of mainly protecting and stabilizing the surface of the conductor of the photoelectric conversion device portion 1 and the TFT portions 3 and 4; and a wear resisting layer 8 formed on the passivation layer 18 and made of microsheet glass or the like for the purpose of protecting the photoelectric conversion device and the like from the friction with original document P which is conveyed by original-document conveying rollers T.

The conventional photoelectric conversion apparatus thus-constituted has a light source S disposed adjacent to the light transmissive substrate 10 on the side opposing the original document P. Illuminating light L emitted from the light source S transmits the light through transmissive substrate 10 before the original document P is irradiated with it. Reflected light L' from it is received by the photoelectric conversion device portion 1. Optical information made incident upon the photoelectric conversion device portion 1 is converted into an optical current before it is registered as a charge in the registering capacitor portion 2. Then, the charge is transmitted to the matrix signal circuit portion 5 by the switching action performed by the TFT portion 3 before it is read out from outside.

FIGS. 2A to 2C respectively illustrate a method of manufacturing a conventional photoelectric conversion apparatus disclosed in Japanese Patent Laid-Open No. 1-128578, more particularly, illustrate a method of adhering a wear-resisting layer to the surface of the photoelectric conversion device.

First, as shown in FIG. 2A, a plurality of photoelectric conversion arrays are formed in the sub-scanning direction (direction Y shown in FIG. 2A), the photoelectric conversion array being constituted by forming the photoelectric conversion device portion 1 and the TFT portion 3 in the main scanning direction (direction Y shown in FIG. 2A) on a large-size glass substrate 50 to an extent of, for example, 1728 bits. Furthermore, a passivation layer 18 made of a polyimide resin is formed on the photoelectric conversion array. Then, as shown in FIG. 2B, an adhesive agent 19 made of an epoxy resin is applied to the substrate except for the contact electrode 17 in which a bonding pad is formed for the purpose of establishing an electric connection with an external circuit (omitted from illustration) so as to place the wear resisting layer 8 made of thin plate glass and having a light transmissive electrostatic shielding layer on the lower surface thereof on the above-described adhesive agent 19. Then, as shown in FIG. 2C, a pressing roller R is used to press the thin plate glass adjacent to the contact electrode portion 17 in the scanning direction while starting from the end portion of the thin plate glass 8 so that the thin plate glass 8 is caused to adhere to the surface of the photoelectric conversion device. Then, the adhesive layer 9 is hardened before the substrate is sliced along separation lines 19 so that the photoelectric conversion arrays are formed.

However, the above-described conventional photoelectric conversion apparatus encounters the following problems when its overall cost is required to be further reduced.

In order to reduce the overall cost of the photoelectric conversion apparatus, a method is employed in which the sub-scanning directional width of the light transmissible substrate on which the photoelectric conversion device portion and the like are formed is reduced. The photoelectric conversion apparatus of the above-described type is manufactured in such a manner that a plurality of photoelectric conversion arrays are simultaneously formed on the large-size light transmissive substrate before it is separated into each photoelectric conversion array so that individual array-shape photoelectric conversion apparatuses are formed. That is, by reducing the width of the light transmissive substrate on which the photoelectric conversion device portion and the like are formed, the number of the photoelectric conversion arrays which can be formed on the large size substrate can be increased. As a result, the cost of the photoelectric conversion array can be reduced.

In a case of the conventional photoelectric conversion apparatus in which the organic material such as polyimide is employed to form the passivation layer, it is difficult to reduce the cost by simply reducing the width of the substrate because of a problem of deterioration in the moisture resistance. The reason for this lies in that, since the organic material such as polyimide has a moisture absorbing characteristic or water permeability, water is, with time, introduced into the photoelectric conversion apparatus through its end portions of the substrate shown in FIG. 1A as water introduction areas, causing the semiconductor layer formed in the photoelectric conversion device portion or the TFT portion to be deteriorated. The conventional photoelectric conversion apparatus has been arranged in such a manner that the regions from the end portion of the substrate to the photoelectric conversion device portion and the TFT portion are enlarged so as to delay the time in which water introduced through the end portion of the substrate reaches the semiconductor layer of the photoelectric conversion device portion or the TFT portion. Thus, the margin enabling the moisture resistance of a practical level to be realized has been maintained.

Therefore, it is difficult for the conventional photoelectric conversion apparatus the passivation layer of which is made of an organic material to reduce the width of the substrate in terms of maintaining the practical performance. Therefore, it has been difficult to provide a photoelectric conversion apparatus the cost of which can further be reduced while maintaining the performance of the level which has been realized in the conventional apparatus.

On the other hand, it might be considered feasible to employ a method of reducing the cost by using an inorganic thin film material such as silicon nitride film or silicon oxide film displaying substantially no water permeability to maintain the moisture resistance of the photoelectric conversion apparatus and to reduce the width of the substrate.

However, in a case where the inorganic thin film material is used to form the passivation layer, there arise the problems shown in FIGS. 3A and 3B, which are the cross sectional views taken along line C—C' of FIG. 1B.

With the above-described conventional method of adhering the thin plate glass to the surface of the photoelectric conversion device, an end portion 20 of the thin plate glass 8 on the surface of which the light transmissive electrostatic is formed as shown in FIG. 3A strongly hits the passivation layer 18 and the impact generated in this case will break the passivation layer 18 made of the inorganic thin film. As a result, a crack 21 is generated in the passivation layer, causing the moisture resistance to be deteriorated. Furthermore, when the thin plate glass 8 placed on the photoelectric conversion device is caused to adhere to the above-described portion by pressure, the crack 21 deteriorating the moisture resistance will be generated in the passivation layer 18 made of the inorganic thin film due to the stress concentration taking place in the stepped portion in the photoelectric conversion device portion and the circuit portion or a hillock 28A excessively grown in the Al circuit portion 28.

If the crack is generated in the passivation layer, a fact that the following phenomena will take place has been confirmed:

(1) Water introduced through the crack will deteriorate the semiconductor layer of the photoelectric conversion device portion or the TFT portion. As a result, the S/N of the photoelectric conversion apparatus is deteriorated.

(2) Water introduced through the crack and impurities such as chloride ions (Cl-) contained in the adhesive layer will corrode the Al circuit portion due to a bias effect applied to the inside portion of the photoelectric conversion apparatus. Consequently, the Al circuit portion can be disconnected.

Therefore, the durability cannot be satisfactorily maintained simply by making the inorganic thin film material to be the passivation layer. As a result, there is a room to be improved for the purpose of further reducing the cost of the photoelectric conversion apparatus.

SUMMARY OF THE INVENTION

To this end, an object of the present invention is to provide a photoelectric conversion apparatus having a protection layer exhibiting excellent durability and the manufacturing cost of which can be reduced.

Another object of the present invention is to provide a photoelectric conversion apparatus constituted in such a manner that a passivation layer made of an inorganic thin film material such as a silicon nitride film, a silicone oxide film or a silicon, nitrogen oxide film is formed on the semiconductor layer such as a photoelectric conversion device, a shock absorbing layer made of an organic film made of a polyimide resin, a silicone resin or a polyamide resin is formed on the passivation layer and, on the shock absorbing layer, a wear resisting layer made of thin plate glass is adhered via an adhesive layer so that a load acting on the inorganic thin film passivation layer at the time of adhering the thin plate glass to the photoelectric conversion devices can be reduced, thereby the inorganic thin film passivation layer can be protected from damage and the moisture resistance of the photoelectric conversion apparatus can be satisfactorily maintained.

Another object of the present invention is to provide a photoelectric conversion apparatus in which the passivation layer made of an inorganic thin film can be protected from damage, the sub-scanning directional width of the light transmissive substrate, which constitutes the photoelectric conversion device portion, can be reduced and the overall cost of the photoelectric conversion apparatus can further be reduced.

Furthermore, another object of the present invention is to provide a photoelectric conversion apparatus constituted in such a manner that a passivation layer made of an inorganic thin film material such as a silicon nitride film, a silicon oxide film or a silicone nitrogen oxide film is formed on the conductive layer such as a drive circuit and signal lines as well as the semiconductor layer such as a photoelectric conversion device, a shock absorbing layer made of an organic film made of a polyimide resin, a silicone resin or a polyamide resin is formed between an end portion of a wear resisting layer made of thin plate glass and the drive circuit or the signal lines so that a load acting on the inorganic thin film passivation layer at the time of fixing the thin plate glass to the photoelectric conversion devices can be reduced, thereby the inorganic thin film passivation layer can be protected from damage and the moisture resistance of the photoelectric conversion apparatus can be satisfactorily maintained.

BRIEF DESCRIPTION OF THE DRAWINGS

FIGS. 3A and 3B respectively are schematic views which illustrate problems experienced with the conventional photoelectric conversion apparatus;

FIGS. 4A to 4C respectively are a main scanning directional schematic cross sectional view, a plan view and a sub-scanning directional cross sectional view which illustrate an embodiment of a photoelectric conversion apparatus according to the present invention;

FIG. 6 is a schematic plan view which illustrates another embodiment of the photoelectric conversion apparatus according to the present invention;

FIG. 8 is schematic structural view which illustrates a facsimile machine to which the photoelectric conversion apparatus according to the present invention is adapted.

DETAILED DESCRIPTION OF THE PREFERRED EMBODIMENTS

Figure 1A:
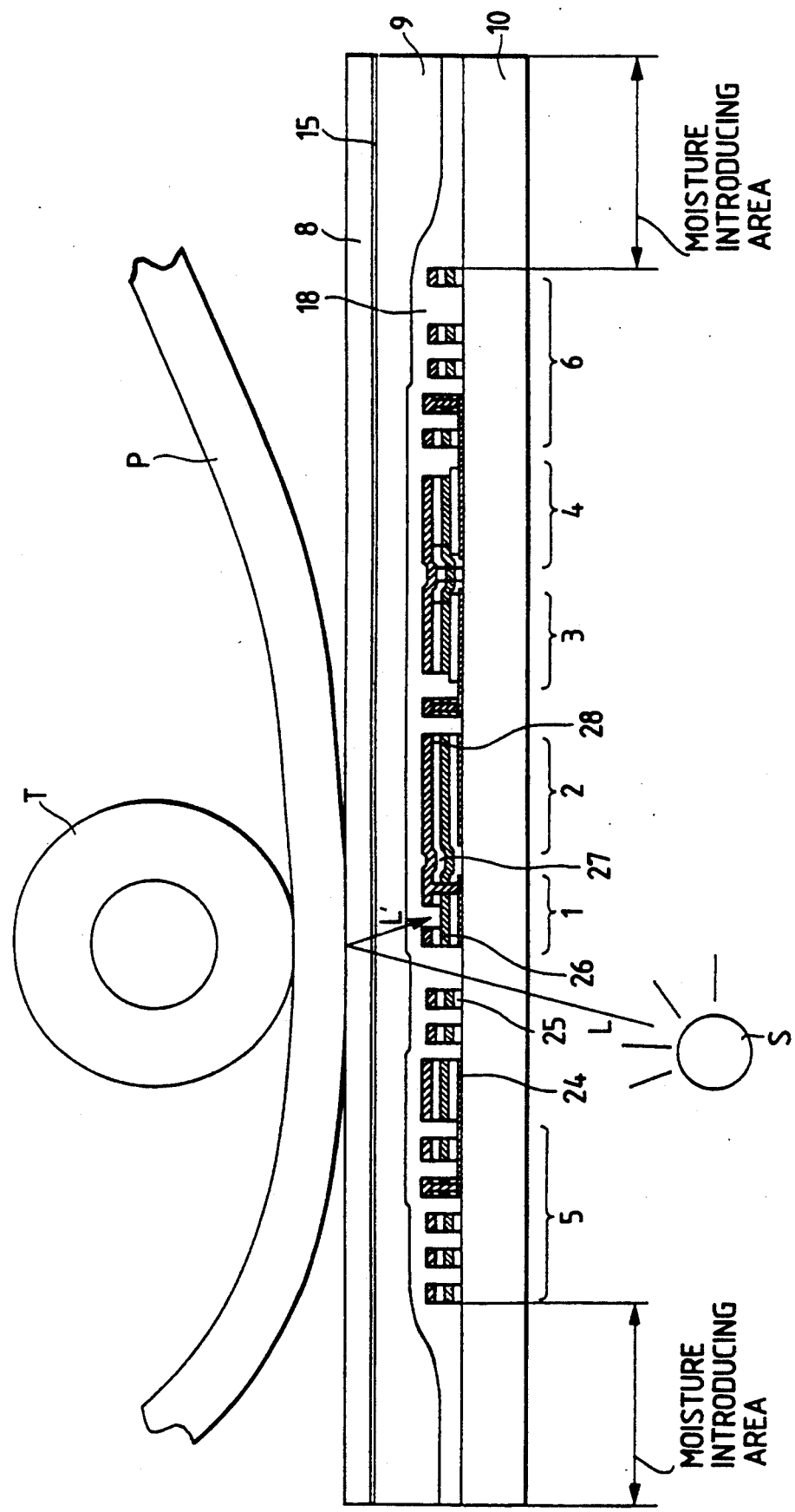
FIGS. 1A and 1B respectively are a main scanning directional schematic cross sectional view and a plan view of a conventional photoelectric conversion apparatus.
Figure 1B:
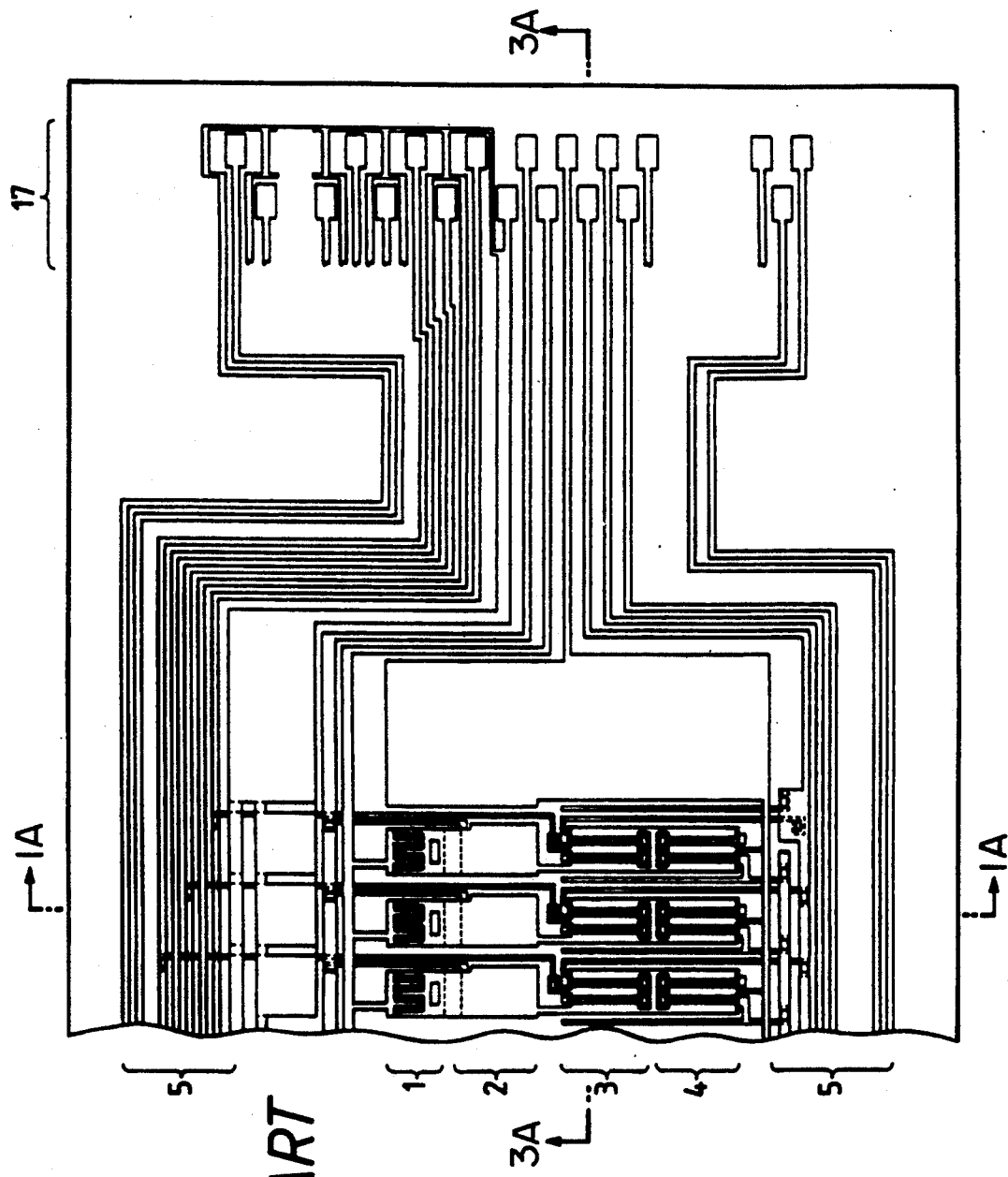
Figure 2A:
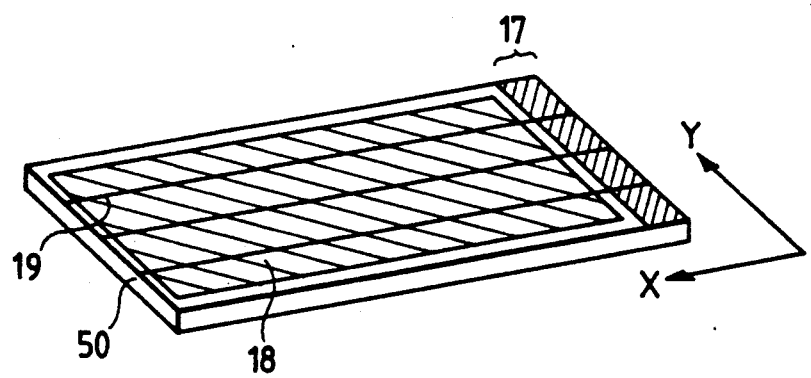
FIGS. 2A to 2C respectively are schematic views which illustrate a method of manufacturing the conventional photoelectric conversion apparatus.
Figure 2B:
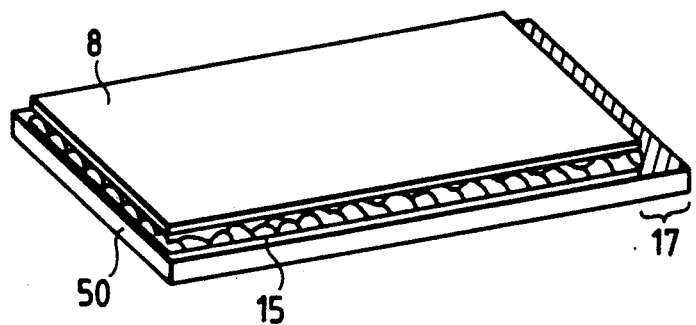
Figure 2C:
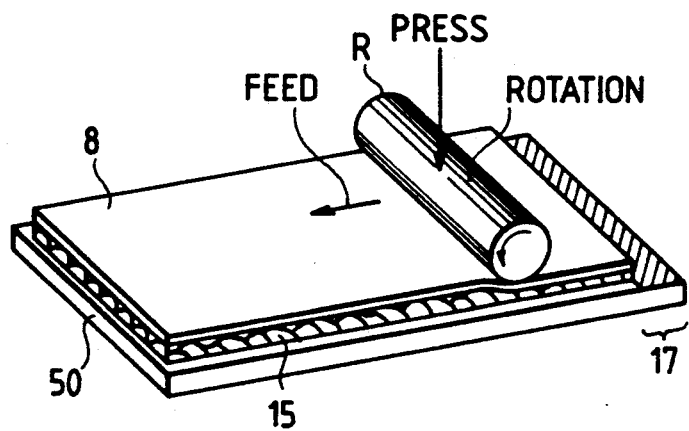
Figure 3A:
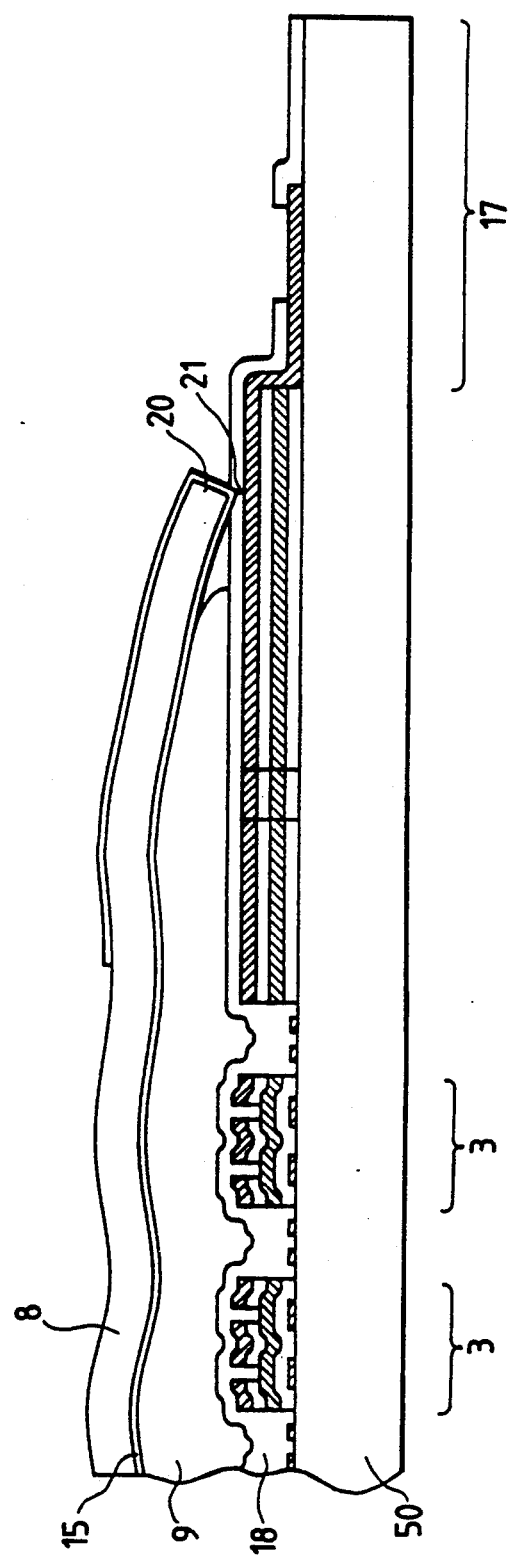

Then, a photoelectric conversion apparatus according to the present invention will now be described.

In order to achieve the above-described objects, according to an aspect of the present invention, there is provided a photoelectric conversion apparatus having, on a light transmissive substrate, a plurality of photoelectric conversion devices and a plurality of light transmissive protection layers formed on the plurality of photoelectric conversion devices and arranged in such a manner that an original document is disposed on the light transmissive protection layers on the side opposing the side which confronts the photoelectric conversion devices, light is emitted from a light source confronting the light transmissive substrate on the side opposing the original document, transmitted through the light transmissible substrate and applied to the original document and reflected light from the original document is received by the plurality of photoelectric conversion devices, the photoelectric conversion apparatus comprising an improvement in that: the light transmissive protection layer is formed by sequentially laminating a protection layer made of an inorganic thin film, a shock absorbing layer made of an organic film and, via an adhesive layer, a wear resisting layer made of thin plate glass.

According to another aspect of the present invention, there is provided a photoelectric conversion apparatus having, on a light transmissive substrate, a plurality of photoelectric conversion devices, a drive circuit for driving the photoelectric conversion devices and signal lines for reading out electric signals transmitted from the photoelectric conversion devices and arranged in such a manner that a wear resisting layer made of thin plate glass is formed on the photoelectric conversion devices, the drive circuit and the signal lines, an original document is disposed on the wear resisting layer to confront the photoelectric conversion devices, light is emitted from a light source which is disposed to confront the light transmissive substrate on the side opposing the original document, transmitted through the light transmissible substrate and applied to the original document and reflected light from the original document is received by the photoelectric conversion devices so that electric signals transmitted from the photoelectric conversion devices can be read out through the signal lines, the photoelectric conversion apparatus comprising: a protection layer made of an inorganic thin film and formed on at least the photoelectric conversion devices, the drive circuit and the signal lines; and a shock absorbing layer made of an organic film and disposed at least between an end portion of the wear resisting layer and the light transmissive substrate.

As a result of the structure of the present invention, the overall cost of the photoelectric apparatus can further be reduced.

The photoelectric conversion apparatus is constituted in such a manner that a passivation layer made of an inorganic thin film material such as a silicon nitride film, a silicone oxide film or a silicon nitride oxide film is formed on the semiconductor layer such as a photoelectric conversion device, a shock absorbing layer made of an organic film made of a polyimide resin, a silicone resin or a polyamide resin is formed on the passivation layer and, on the shock absorbing layer, a wear resisting layer made of thin plate glass is attached via an adhesive layer. As a result, a load acting on the inorganic thin film passivation layer at the time of attaching the thin plate glass to the photoelectric conversion devices can be reduced, thereby the inorganic thin film passivation layer can be protected from damage and the moisture resistance of the photoelectric conversion apparatus can be satisfactorily maintained.

Furthermore, according to the present invention, the passivation layer made of an inorganic thin film can be protected from damage and thereby the sub-scanning directional width of the light transmissive substrate, which constitutes the photoelectric conversion device portion, can be reduced. As a result, the overall cost of the photoelectric conversion apparatus can further be reduced.

Furthermore, according to the present invention, the photoelectric conversion apparatus is constituted in such a manner that a passivation layer made of an inorganic thin film material such as a silicon nitride film, a silicone oxide film or a silicon nitride oxide film is formed on the conductive layer such as a drive circuit and signal lines as well as the semiconductor layer such as a photoelectric conversion device, a shock absorbing layer made of an organic film made of a polyimide resin, a silicone resin or a polyamide resin is formed between an end portion of a wear resisting layer made of thin plate glass and the drive circuit or the signal lines. As a result, a load acting on the inorganic thin film passivation layer at the time of attaching the thin plate glass to the photoelectric conversion devices can be reduced, thereby the inorganic thin film passivation layer can be protected from damage and the moisture resistance of the photoelectric conversion apparatus can be satisfactorily maintained.

Embodiment 1

Embodiment 1 of the present invention will now be described with reference to the drawings FIGS. 4A to 4C respectively are a main scanning directional schematic cross sectional view, a plan view and a sub-scanning directional cross sectional view of an embodiment of the photoelectric conversion apparatus according to the present invention.

Figure 4A:
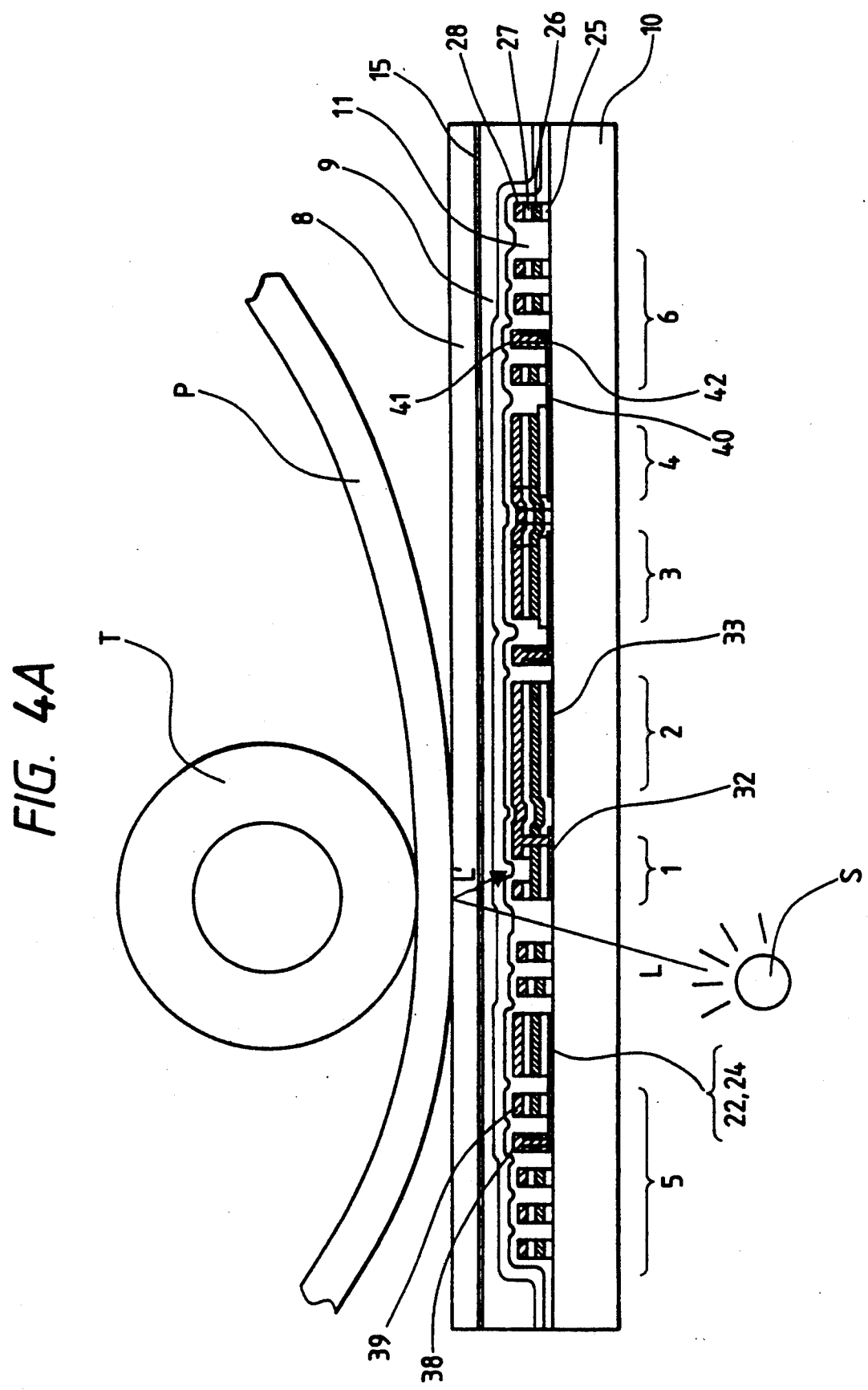
Figure 4C:
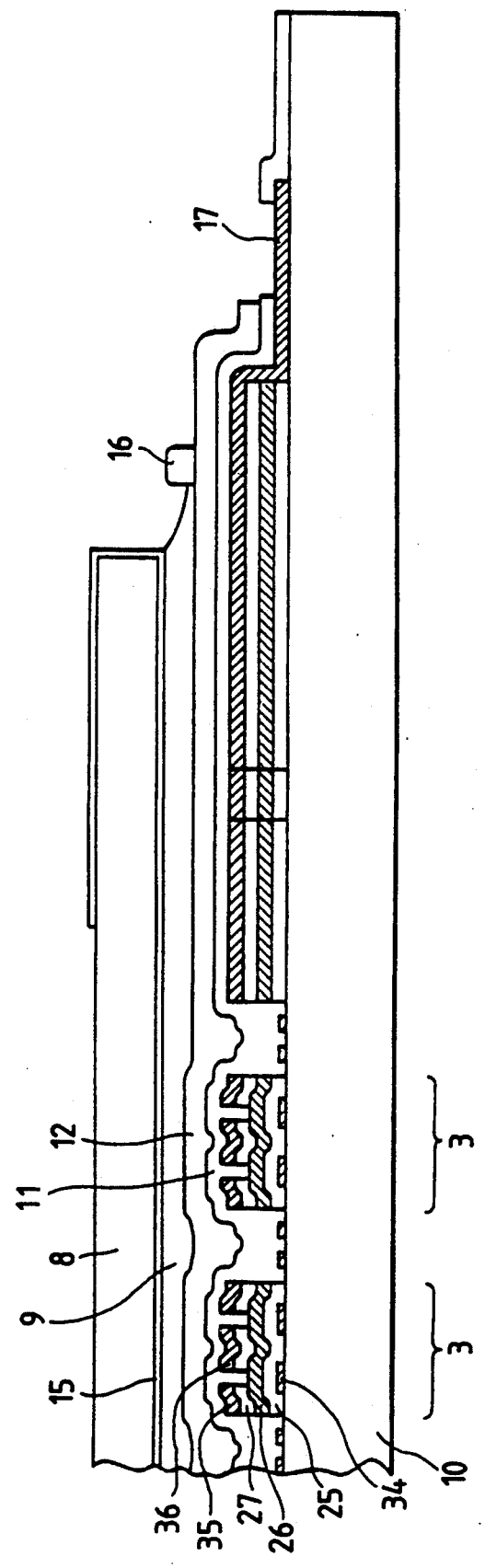

FIGS. 4A and 4C respectively are a cross sectional view taken along line A—A' and that taken along line C—C' of FIG. 4B.

According to this embodiment, a-Si:H (amorphous silicon hydride) is used as a semiconductor layer to, by the same process, integrally form, on a light transmissive insulating substrate 10, a photoelectric conversion device portion 1, a registering capacitor portion 2, TFT (Thin Film Transistor) portions 3 and 4, a matrix signal circuit portion 5 and a gate drive circuit portion 6.

On the insulating substrate 10, there are formed a first conductive layer 24 made of, for example, Cr, an insulating layer 25 made of SiN or the like, a photoconductive semiconductor layer 26 made of a-Si:H, an ohomic contact layer 27 made of n+ a-Si:H and a second conductive layer 28 made of Al.

The photoelectric conversion device portion 1 has upper electrode circuits 30 and 31. Light L emitted from the light source S travels in such a manner that signal light L' reflected by original document P changes the conductance of the photoconductive semiconductor layer 26 made of a-Si:H so that an electric current which passes between the upper electrode circuits 30 and 31 confronting each other in a comb shape manner is changed. Reference numeral 32 represents a metallic light shielding layer which may be made to be a control electrode (a gate electrode) confronting main electrodes 30 (a source electrode or a drain electrode) and 31 (a drain electrode or a source electrode) and connected to a drive power source.

The registering capacitor portion 2 is constituted by a lower electrode circuit 33, the insulating layer 25 and the photoconductive semiconductor 26 formed on the lower electrode circuit 33 and a circuit connected to the upper electrode circuit 31 of the photoelectric conversion portion 1 formed on the photoconductive semiconductor 26. The register capacitor portion 2 is formed into a so-called MIS capacitor. Although either the positive and the negative biasing condition may be used, a stable capacity and a frequency characteristic can be obtained by using the registering capacitor portion 2 in such a manner that the lower electrode circuit 33 is always biased negatively.

The TFT portions 3 and 4 are constituted by a lower electrode circuit 34 serving as a gate electrode, the insulating layer 25 forming a gate insulating layer, the semiconductor layer 26, an upper electrode circuit 35 serving as a source electrode and an upper electrode circuit 36 serving as a drain electrode.

In the matrix signal circuit portion 5, an individual signal line 22 made of the first conductive layer, the insulating layer 25 for covering the individual signal line 22, the semiconductor layer 26 and a common signal line 37 intersecting the individual signal line 22 and made of the second conductive layer are sequentially layered on the substrate 10. Reference numeral 38 represents a contact hole for establishing an ohmic contact between the individual signal line 22 and the common signal line 37 and 39 represents a line shield disposed between the common signal lines 37.

In the TFT driving gate circuit portion 6, an individual gate line 40 made of the first conductive layer 24, the insulating layer 25 for covering the individual gate lines 40, the semiconductor layer 26, the ohmic contact layer 27 and a common gate lines 41 intersecting the individual gate lines 40 and made of the second conductive layer 28 are sequentially formed on the substrate 10. Reference numeral 42 represents a contact hole for establishing an ohmic contact between the individual gate line 40 and the common gate line 41.

As described above, the photoelectric conversion apparatus according to this embodiment is arranged in such a manner that all of the photoelectric conversion device portion, the registering capacitor portion, the TFT portion, the matrix signal circuit portion and the gate drive circuit portion are respectively formed into laminated structures composed of the photoconductive semiconductor layer, the insulating layer and the conductive layer. Therefore, each of the portions is simultaneously formed by the same process.

Furthermore, a passivation layer 11 made of an inorganic thin film made of SiN or the like is formed on the second conductive layer 28 for the purpose of mainly protecting and stabilizing the surfaces of the semiconductors of the photoelectric conversion device portion 1 and the TFT portions 3 and 4. On the passivation layer 11, a shock absorbing layer 12 made of a polyimide resin is formed. In addition, a wear resisting layer 8 made of microsheet glass or the like is, via an adhesive layer 9, secured by adhesion to the surface of the shock absorbing layer 12 for the purpose of protecting the photoelectric conversion device and the like from the friction with the original document P.

In order to prevent adverse effects from the static electricity generated due to the friction between the original document P and the wear resisting layer 8 on the photoelectric conversion device and the like, it is preferable that a static electricity prevention layer 15 made of a light transmissive conductive layer such as ITO be formed between the passivation layer 11 and the wear resisting layer 8. The static electricity prevention layer may be extended to the surface of the wear resisting layer 8 for the purpose of grounding.

Then, a specific method of manufacturing the photoelectric conversion apparatus according to the present invention will now be described.

First, Cr was deposited on the large-size insulating substrate made of glass or the like by a thickness of 1000 Å by sputtering. Then, patterning was performed to obtain a predetermined shape so that the first conductive layer 24 was formed. Then, the insulating layer 25 made of SiN, the semiconductor layer 26 made of a-Si:H and the ohmic contact layer 27 made of n+a-Si:H were continuously deposited by the plasma CVD method.

The film forming conditions for forming each of the layers are as shown in Table 1.

TABLE 1

| Film | Gas | Temperature of Substrate | Electricity Discharged | Film Thickness |
|---|---|---|---|---|
| Insulating Layer | $SiH_4$ = 10 SCCM<br>$NH_3$ = 280 SCCM | 350° C. | 30 W | 3000Å |
| Semiconductor Layer | $SiH_4$ = 60 SCCM<br>$H_2$ = 540 SCCM | 250° C. | 60 W | 5000Å |
| Ohmic Contact Layer | $PH_3/SiH_4$ = 5000 ppm/3 SCCM | 200° C. | 200 W | 1000Å |

(Area of electrode in the plasma CVD apparatus is 2500 cm$^2$)

Then, Al which was the conductive material serving as the source and drain electrode was deposited by sputtering by a thickness of 5000 Å. Then, patterning to form a desired shape was performed so that the second conductive layer 28 was formed.

Then, an unnecessary ohmic contact layer was removed by etching so that the channels for the photoelectric conversion device portion 1 and the TFT portions 3 and 4 were formed. The removal of the ohmic contact layer was performed by reactive ion etching.

Then, the semiconductor layer formed between the photoelectric conversion devices was removed by etching so that the photoelectric conversion devices were separated from each other.

Then, the SiN layer was, as the passivation layer 11, deposited by the plasma CVD method on the overall surface of the large-size substrate on which the photoelectric conversion device had been formed.

If the temperature of the substrate is excessively raised when the passivation layer 11 is formed, hydrogen contained in the semiconductor layer 26 will be undesirably removed or a relative diffusion can take place between the Al which forms the second conductive layer and the ohmic contact layer 27. Therefore, it is preferable that the temperature of the substrate at this time does not exceed the temperature of the substrate arranged when the insulating layer 25, the semiconductor layer 26 and the ohmic contact layer 27 are formed. In a case of the photoelectric conversion apparatus having the semiconductor layer made of a-Si:H, the temperature of the substrate when a-Si:H is deposited is 150° C. to 250° C. Therefore, it is preferable that the temperature of the substrate when the passivation layer 11 is formed be 150° C. or lower. Therefore, the passivation layer 11 of the photoelectric conversion apparatus according to the present invention and having a thickness of 6000 Å was formed by arranging the temperature of the substrate to be 150° C. and using a gas composed of $SiH_4$=4SCCM and $N_2$=200SCCM ($SiH_4:N_2$=1:50) under a pressure level of 0.2 Torr with a discharge electricity of 100 W. The passivation layer 11 may be formed by silicon oxide (SiO), silicone nitrogen oxide (SiON) or the like as well as silicon nitride (SiN).

Then, the passivation layer 11 formed on the bonding pad 17 for the wire bonding was removed by etching before a polyimide resin was applied by using a spinner by a thickness of about 3 μm to the passivation layer 11 made of SiN. Then, they were hardened by heat so that the shock absorbing layer 12 was formed. When the polyimide resin is applied as described above, also the surface of the bonding pad 17 must be covered with masking tape or the like. Also it is preferable that the temperature at which the shock absorbing layer 12 is hardened be made to be 150° or lower similarly to the temperature at which the passivation layer 11 is formed. The shock absorbing layer may be formed by a silicone resin, a polyimide resin or the like as well as the polyimide resin.

Then, an adhesive agent made of an epoxy resin was applied by using a dispenser before placing the thin plate glass 8 on the adhesive agent so as to be pressed to adhere them as disclosed in the related art. Then, the adhesive layer 9 was heated so as to be hardened. In a case where the static electricity must be prevented, an ITO film is previously formed on the surface of the thin plate glass 8. Also the temperature at which the adhesive layer 9 is heated so as to be hardened be made to be 150° C. or lower.

Then, the thin plate glass was fitted to the surface of the large-size insulating substrate by the adhesive before the separation was performed by using the slicer to form each of the photoelectric conversion arrays. Thus, the photoelectric conversion apparatus according to the present invention can be manufactured.

As described above, the photoelectric conversion apparatus according to this embodiment is constituted in such a manner that the shock absorbing layer 12 made of the organic film is layered on the passivation layer 11 made of the inorganic thin film before the thin plate glass 8 is caused to adhere to the shock absorbing layer 12 via the adhesive layer 9.

The shock absorbing layer 12 is disposed between the inorganic thin film passivation layer 11 formed on the photoelectric conversion device 1 and the thin plate glass 8. Therefore, an impact load acting to the inorganic thin film passivation layer 11 when the thin plate glass 8 is adhered to the surface of the photoelectric conversion device 1 can be absorbed. Therefore, it acts to prevent the breakage of the inorganic thin film passivation layer 11. Further specifically, the shock absorbing layer 12 is formed from a circuit region in which the end portion of the thin plate glass 8 strikes at the time of adhering the thin plate glass 8 to the region in which the thin plate glass is affixed. As a result, the load applied from the end portion of the thin plate glass 8 to the inorganic thin film passivation layer 11 can be absorbed. Furthermore, the load acting on the stepped portion in the photoelectric conversion device portion 1 and the like can be absorbed.

It is preferable that the shock absorbing layer 12 be made of a material which enables the above-described low temperature forming to be performed and which is relatively soft in comparison to the inorganic passivation layer 11. In addition, it is preferable that the shock absorbing layer 12 be flexibly deformed when a large load acts when the thin plate glass 8 is adhered so as to disperse or absorb the load and to reduce the load acting on the inorganic thin film passivation layer 11 per unit area for purpose of preventing the cracks.

Furthermore, it is preferable that the shock absorbing layer 12 possesses flexibility in comparison to that possessed by the adhesive layer 9 which adhered the thin plate glass 8 to the passivation layer 11 formed on the photoelectric conversion device 1. The reason for this lies in that the stress generated due to hardening of the adhesive layer 9 can also be absorbed and the load acting on the inorganic passivation layer 11 can be reduced.

A flow stopper 16 is formed in the vicinity of the end portion of the thin plate glass 8 formed on the shock absorbing layer 12 for the purpose of preventing the introduction of the adhesive agent, which has not been hardened, into the bonding pad portion 17.

Embodiment 2

Figure 5A:
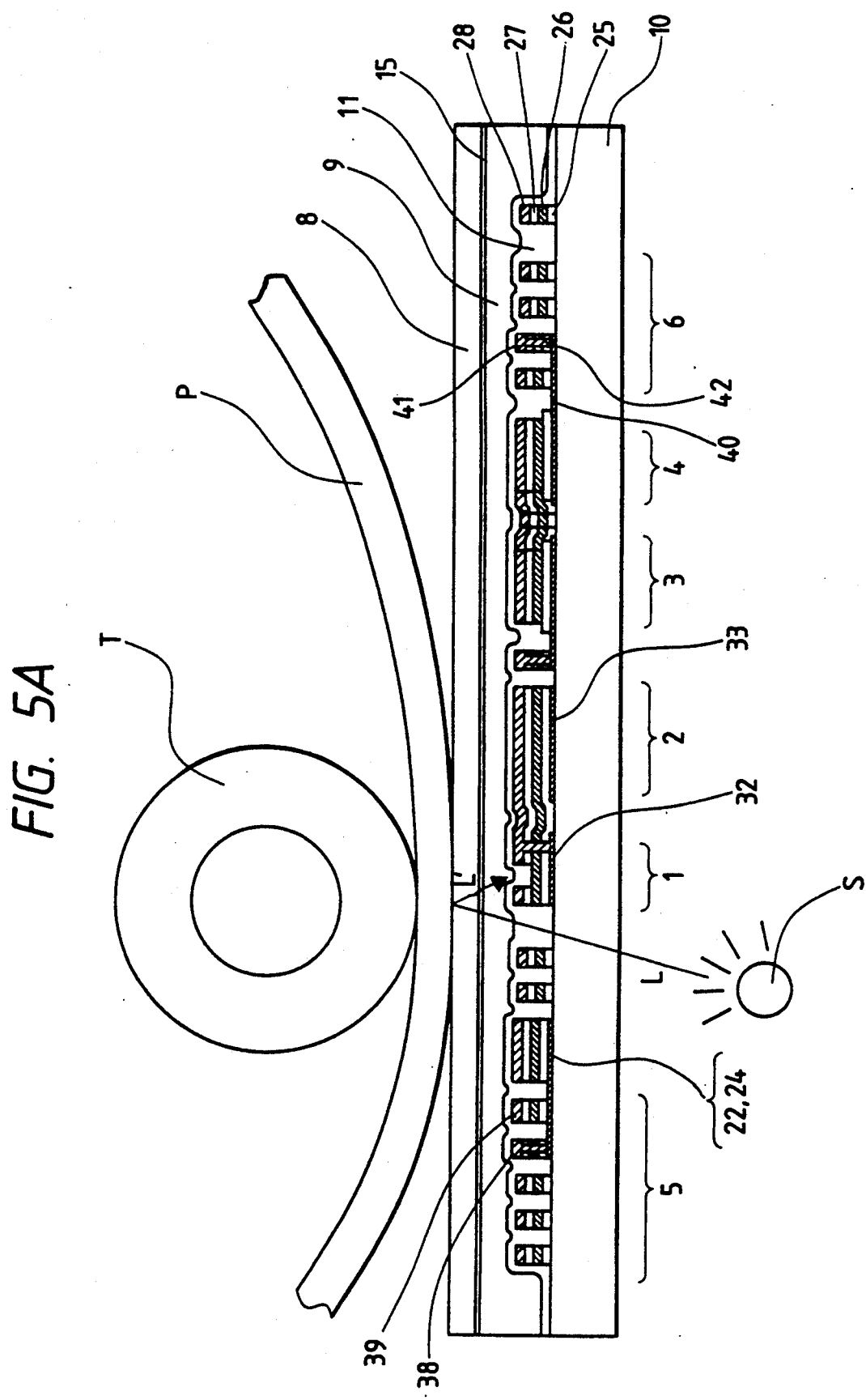
FIGS. 5A to 5C respectively are a main scanning directional schematic cross sectional view, a plan view and a sub-scanning directional cross sectional view which illustrate another embodiment of the photoelectric conversion apparatus according to the present invention.
Figure 5B:
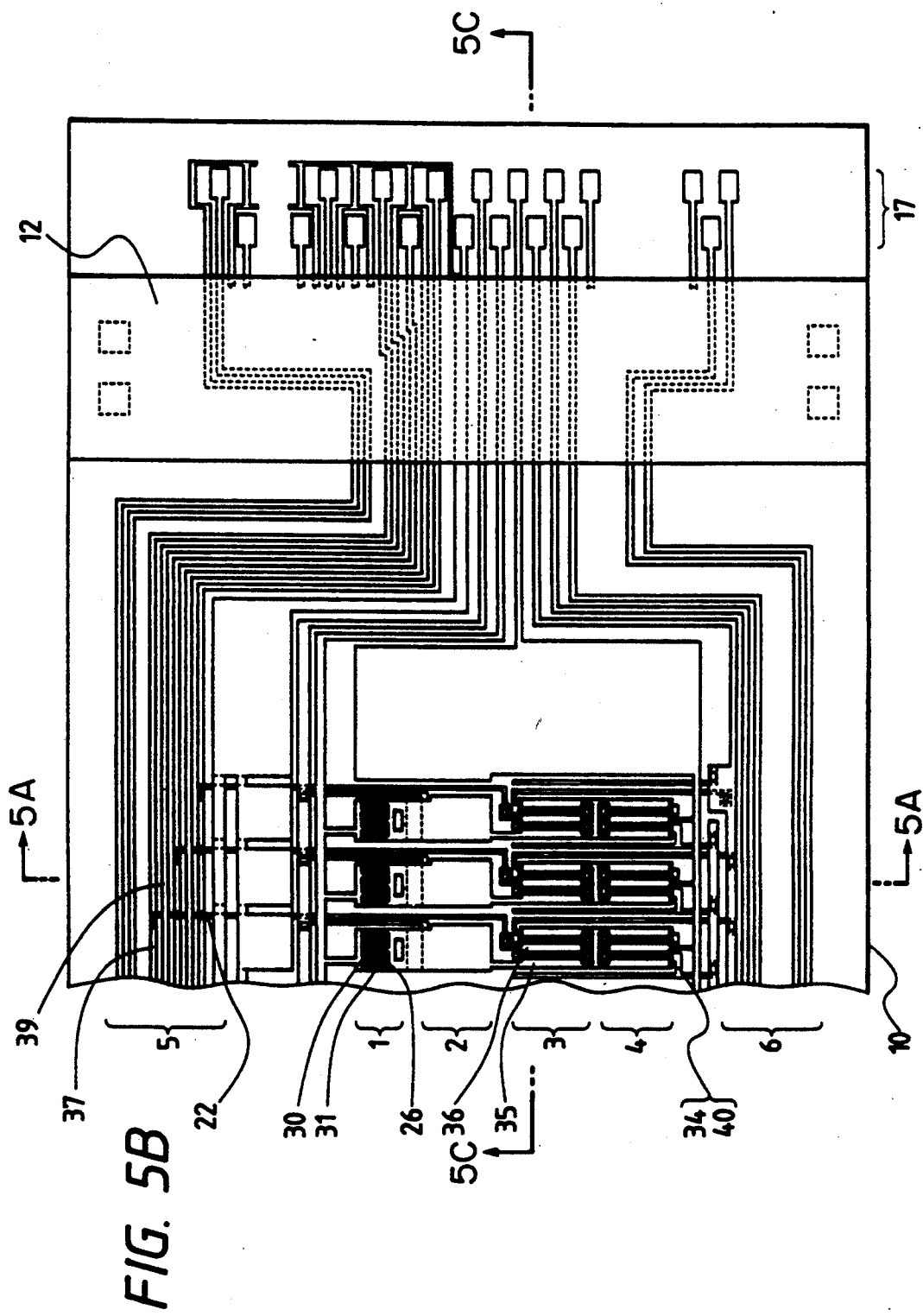
Figure 5C:
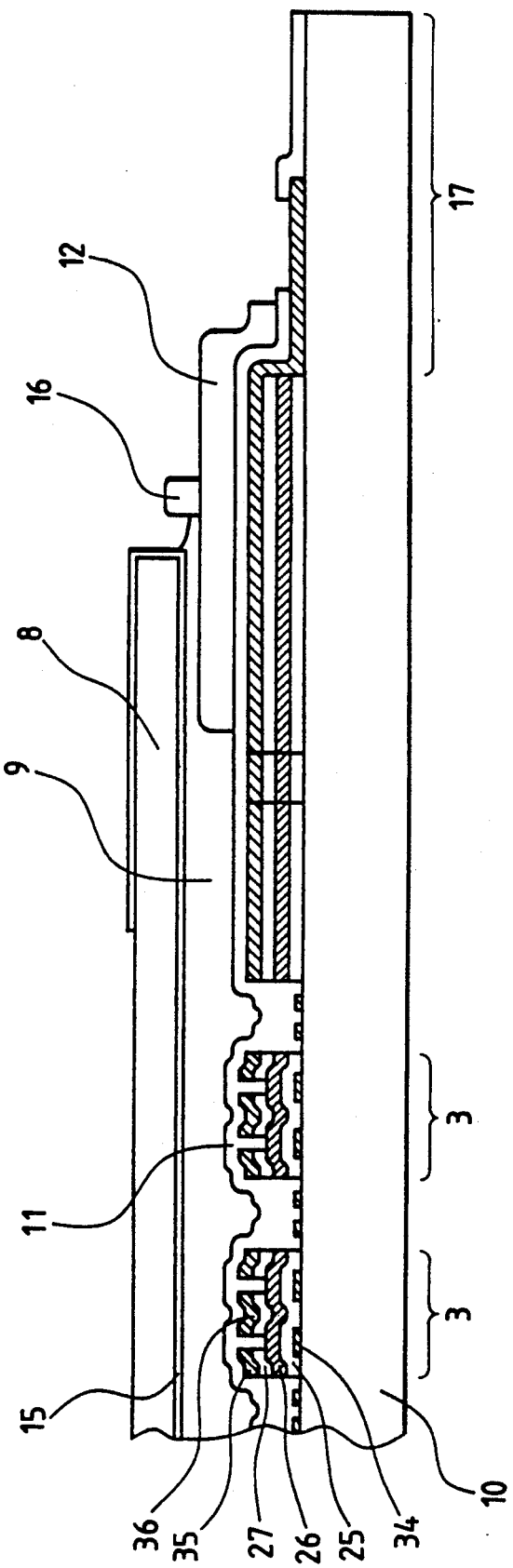

FIGS. 5A to 5C respectively are a main scanning directional schematic cross sectional view, a plan view and a sub-scanning directional cross sectional view which illustrate Embodiment 2 of the photoelectric conversion apparatus according to the present invention.

FIGS. 5A and 5C respectively are a cross sectional view taken along line A—A' and that taken along line C—C' of FIG. 5B.

According to Embodiment 2, a-Si:H is used as a semiconductor layer to, by the same process, integrally form, on a light transmissive insulating substrate 10, a photoelectric conversion device portion 1, a registering capacitor portion 2, TFT portions 3 and 4, a matrix signal circuit portion 5 and a gate drive circuit portion 6.

On the insulating substrate 10, there are formed a first conductive layer 24 made of, for example, Cr, an insulating layer 25 made of SiN or the like, a photoconductive semiconductor layer 26 made of a-Si:H, an ohmic contact layer 27 made of n+ a-Si:H and a second conductive layer 28 made of Al.

The photoelectric conversion device portion 1 has upper electrode circuits 30 and 31. Light L emitted from the light source S travels in such a manner that signal light L' reflected by original document P changes the conductance of the photoconductive semiconductor layer 26 made of a-Si:H so that an electric current which passes between the upper electrode circuits 30 and 31 confronting each other in a comb shape manner is changed. Reference numeral 32 represents a metallic light shielding layer which may be made to be a control electrode (a gate electrode) confronting main electrodes 30 (a source electrode or a drain electrode) and 31 (a drain electrode or a source electrode) and connected to a proper drive power source.

The registering capacitor portion 2 is constituted by a lower electrode circuit 33, the insulating layer 25 and the photoconductive semiconductor 26 formed on the lower electrode circuit 33 and a circuit connected to the upper electrode circuit 31 of the photoelectric conversion portion 1 formed on the photoconductive semiconductor 26. The register capacitor portion 2 is formed into a so-called MIS capacitor. Although either the positive and the negative biasing condition may be used, a stable capacity and a frequency characteristic can be obtained by using the registering capacitor portion 2 in such a manner that the lower electrode circuit 33 is always biased negatively.

The TFT portions 3 and 4 are constituted by a lower electrode circuit 34 serving as a gate electrode, the insulating layer 25 forming a gate insulating layer, the semiconductor layer 26, an upper electrode circuit 35 serving as a source electrode and an upper electrode circuit 36 serving as a drain electrode.

In the matrix signal circuit portion 5, an individual signal line 22 made of the first conductive layer, the insulating layer 25 for covering the individual signal line 22, the semiconductor layer 26 and a common signal line 37 intersecting the individual signal line 22 and made of the second conductive layer are sequentially layered on the substrate 10. Reference numeral 38 represents a contact hole for establishing an ohmic contact between the individual signal line 22 and the common signal line 37 and 39 represents a line shield disposed between the common signal lines 37.

In the TFT driving gate circuit portion 6, an individual gate line 40 made of the first conductive layer 24, the insulating layer 25 for covering the individual gate lines 40, the semiconductor layer 26, the ohmic contact layer 27 and a common gate lines 41 intersecting the individual gate lines 40 and made of the second conductive layer 28 are sequentially formed on the substrate 10. Reference numeral 42 represents a contact hole for establishing an ohmic contact between the individual gate line 40 and the common gate line 41.

As described above, the photoelectric conversion apparatus according to Embodiment 2 is arranged in such a manner that all of the photoelectric conversion device portion, the registering capacitor portion, the TFT portion, the matrix signal circuit portion and the gate drive circuit portion are respectively formed into laminated structures composed of the photoconductive semiconductor layer, the insulating layer and the conductive layer. Therefore, each of the portions is simultaneously formed by the same process.

Furthermore, a passivation layer 11 made of an inorganic thin film made of SiN or the like is formed on the second conductive layer 28 for the purpose of mainly protecting and stabilizing the surfaces of the semiconductors of the photoelectric conversion device portion 1 and the TFT portions 3 and 4. On the passivation layer 11, a shock absorbing layer 12 made of a polyimide resin is formed. In addition, a wear resisting layer 8 made of microsheet glass or the like is, via an adhesive layer 9, secured by adhesion to the surface of the shock absorbing layer 12 for the purpose of protecting the photoelectric conversion device and the like from the friction with the original document P.

In order to prevent the adverse affection of the static electricity generated due to the friction between the original document P and the wear resisting layer 8 on the photoelectric conversion device and the like, it is preferable that a static electricity prevention layer 15 made of a light transmissive conductive layer such as ITO be formed between the passivation layer 11 and the wear resisting layer 8. The static electricity prevention layer may be extended to the surface of the wear resisting layer 8 for the purpose of grounding.

As shown in FIG. 5B, the shock absorbing layer 12 is formed between the photoelectric conversion device 1 and the contact electrode portion 17 between the gate drive circuit portion 6 and the matrix signal line portion 5, the shock absorbing layer 12 being disposed in a circuit region in which the photoelectric conversion 1 and the contact electrode portion 17 are not formed.

Then, a specific method of manufacturing the photoelectric conversion apparatus according to the present invention will now be described.

First, Cr was deposited on the large-size insulating substrate made of glass or the like by a thickness of 1000 Å by sputtering. Then, patterning was performed to obtain a predetermined shape so that the first conductive layer 24 was formed. Then, the insulating layer 25 made of SiN, the semiconductor layer 26 made of a-

Si:H and the ohmic contact layer 27 made of n+a-Si:H were continuously deposited by the plasma CVD method.

The film forming conditions for forming each of the layers are as shown in Table 2.

TABLE 2

| Film | Gas | | Temperature of Substrate | Electricity Discharged | Film Thickness |
|---|---|---|---|---|---|
| Insulating Layer | SiH$_4$ = | 10 SCCM | 350° C. | 30 W | 3000Å |
| | NH$_3$ = | 280 SCCM | | | |
| Semiconductor Layer | SiH$_4$ = | 60 SCCM | 200° C. | 60 W | 5000Å |
| | H$_2$ = | 540 SCCM | | | |
| Ohmic Contact Layer | PH$_3$/SiH$_4$ = | 5000 ppm/3 SCCM | 200° C. | 200 W | 1000Å |

(Area of electrode in the plasma CVD apparatus is 2500 cm$^2$)

Then, Al which was the conductive material serving as the source and drain electrode was deposited by sputtering by a thickness of 5000 Å. Then, patterning to form a desired shape was performed so that the second conductive layer 28 was formed.

Then, an unnecessary ohmic contact layer was removed by etching so that the channels for the photoelectric conversion device portion 1 and the TFT portions 3 and 4 were formed. The removal of the ohmic contact layer was performed by reactive ion etching.

Then, the semiconductor layer formed between the photoelectric conversion devices was removed by etching so that the photoelectric conversion devices were separated from each other.

Then, the SiN layer was, as the passivation layer 11, deposited by the plasma CVD method on the overall surface of the large-size substrate on which the photoelectric conversion device had been formed.

If the temperature of the substrate is excessively raised when the passivation layer 11 is formed, hydrogen contained in the semiconductor layer 26 will be undesirably removed or a relative diffusion can take place between the Al which forms the second conductive layer and the ohmic contact layer 27. Therefore, it is preferable that the temperature of the substrate at this time does not exceed the temperature of the substrate arranged when the insulating layer 25, the semiconductor layer 26 and the ohmic contact layer 27 are formed. In a case of the photoelectric conversion apparatus having the semiconductor layer made of a-Si:H, the temperature of the substrate when a-Si:H is deposited is 150° C. to 250° C. Therefore, it is preferable that the temperature of the substrate when the passivation layer 11 is formed be 150° C. or lower. Therefore, the passivation layer 11 of the photoelectric conversion apparatus according to the present invention and having a thickness of 6000 Å was formed by arranging the temperature of the substrate to be 150° C. and using a gas composed of SiH$_4$=4SCCM and N$_2$=200SCCM (SiH$_4$:N$_2$=1:50) under a pressure level of 0.2 Torr with a discharge electricity of 100 W.

The passivation layer 11 may be formed by SiO, SiON or the like as well as SiN.

Then, the passivation layer 11 formed on the bonding pad 17 for the wire bonding was removed by etching before a polyimide resin was selectively applied by the screen printing method by a thickness of 5 to 10 μm on the passivation layer 11 in a circuit region between the photoelectric conversion device portion 1 and the contact electrode portion 17 between the gate drive circuit portion 6 and the matrix signal line portion 5, the polyimide resin being applied to a region which does not include the photoelectric conversion device portion 1 and the contact electrode portion 17. Then, they are hardened by heat so that the shock absorbing layer 12 was formed. At this time, it is preferable that the temperature at which the shock absorbing layer 12 is hardened be made to be 150° C. or lower similarly to the temperature at which the passivation layer 11 is formed.

Then, conditions for performing the screen printing of the shock absorbing layer according to Embodiment 1 will now be described. As the form plate for the screen printing, it is preferable that a mesh made of fiber be employed. In particular, it is further preferable that a mesh made of synthetic resin such as a polyester resin be used. If a metal filament mesh such as stainless steel is used, the metal filament strongly hits the passivation layer made of the inorganic thin film, causing a fear of breaking the passivation layer to arise. However, the breakage of the passivation layer can be prevented by using the synthetic resin mesh. The size of the mesh may be determined in consideration of the viscosity of the polyimide resin and the state of the growth of bubbles. The thickness of the emulsion also be determined properly in consideration of the thickness of the shock absorbing layer. The squeeze may be made of silicone rubber.

The shock absorbing layer 12 may be formed by a silicone resin, a polyimide resin or the like as well as the polyimide resin.

Then, an adhesive agent made of an epoxy resin was applied by using a dispenser after the shock absorbing layer 12 had been formed as described above. Then, the epoxy resin adhesive agent is applied by using a dispenser before placing the thin plate glass 8 on the adhesive agent so as to be pressed to adhere them as disclosed in the related art. Then, the adhesive layer 9 was heated so as to be hardened. In a case where the static electricity must be prevented, an ITO film is previously formed on the surface of the thin plate glass 8. Also, the temperature at which the adhesive layer 9 is heated so as to be hardened is made to be 150° C. or lower.

Then, the thin plate glass was fitted to the surface of the large-size insulating substrate by the adhesive before the separation was performed by using the slicer to form each of the photoelectric conversion arrays. Thus, the photoelectric conversion apparatus according to Embodiment 1 can be manufactured.

Embodiment 2 is constituted in such a manner that the shock absorbing layer 12 made of the organic film is selectively layered on the passivation layer 11 formed between the photoelectric conversion device portion 1 and the contact electrode portion 17 in a circuit region which does not include the photoelectric conversion device portion 1 and the contact electrode portion 17. Furthermore, the thin plate glass 8 is adhered via the adhesive layer 9.

The shock absorbing layer 12 is disposed between the inorganic thin film passivation layer 11 and the thin plate glass 8. Therefore, an impact load acting on the inorganic thin film passivation layer 11 when the thin plate glass 8 is adhered to the surface of the photoelectric conversion device 1 can be absorbed. Therefore, it acts to prevent the breakage of the inorganic thin film passivation layer 11. Further specifically, the shock absorbing layer 12 is formed from a circuit region in which the end portion of the thin plate glass 8 hits at the time of adhering the thin plate glass 8 to the region in which the thin plate glass is attached. As a result, the load applied from the end portion of the thin plate glass to the inorganic thin film passivation layer 11 can be absorbed.

It is preferable that the shock absorbing layer 12 be made of a material which enables the above-described low temperature forming to be performed and which is relatively soft in comparison to the inorganic passivation layer 11. In addition, it is preferable that the shock absorbing layer 12 be flexibly deformed when a large load acts when the thin plate glass 8 is attached so as to disperse or absorb the load and to reduce the load acting on the inorganic thin film passivation layer 11 per unit area for the purpose of preventing the cracks.

A flow stopper 16 is formed in the vicinity of the end portion of the thin plate glass 8 formed on the shock absorbing layer 12 for the purpose of preventing the introduction of the adhesive agent, which has not been hardened, into the bonding pad portion 17.

Embodiment 3

FIG. 6 is a schematic plan view which illustrates Embodiment 3 of the photoelectric conversion apparatus according to the present invention.

Embodiment 3 is constituted in such a manner that the shock absorbing layer 12 made of the organic film is selectively layered in a region between the photoelectric conversion device portion 1 and the contact electrode portion 17 which does not include the photoelectric conversion device portion 1, the contact electrode portion 17 and the circuit portions 5 and 6. The structural difference from Embodiment 2 lies in that: Embodiment 2 is constituted in such a manner that the shock absorbing layer is, in the form of an elongated shape, also formed in the gate drive circuit portion 5 and the matrix signal line portion 6. However, Embodiment 3 is constituted in such a manner that the shock absorbing layer is formed only in the regions except for the gate drive circuit portion 5 and the matrix signal line portion 6.

Embodiment 3 is constituted in such a manner that the shock absorbing layer 12 is formed around the gate drive circuit portion 5 and the matrix signal line portion 6 and the end portion of the thin plate glass 8 is disposed on the shock absorbing layer 12. As a result, the contact of the end portion of the thin plate glass 8 with the inorganic thin film passivation layer 11 formed on the circuit portions 5 and 6 is prevented. The large load generated when the thin plate glass 8 is attached can be relaxed by dispersing or absorbing action performed by the shock absorbing layer 12. Therefore, the passivation layer 11 can be protected from a damage. In addition, a problem of the damage of the passivation layer 11 formed on the gate drive circuit portion 5 and the matrix signal line portion 6 can also be overcome even if the metal filament mesh is used when the shock absorbing layer 12 is selectively formed by the screen printing method.

A flow stopper 16 is formed in the vicinity of the end portion of the thin plate glass 8 formed on the shock absorbing layer 12 for the purpose of preventing the introduction of the adhesive agent, which has not been hardened, into the bonding pad portion 17.

Embodiment 4

Figure 7:
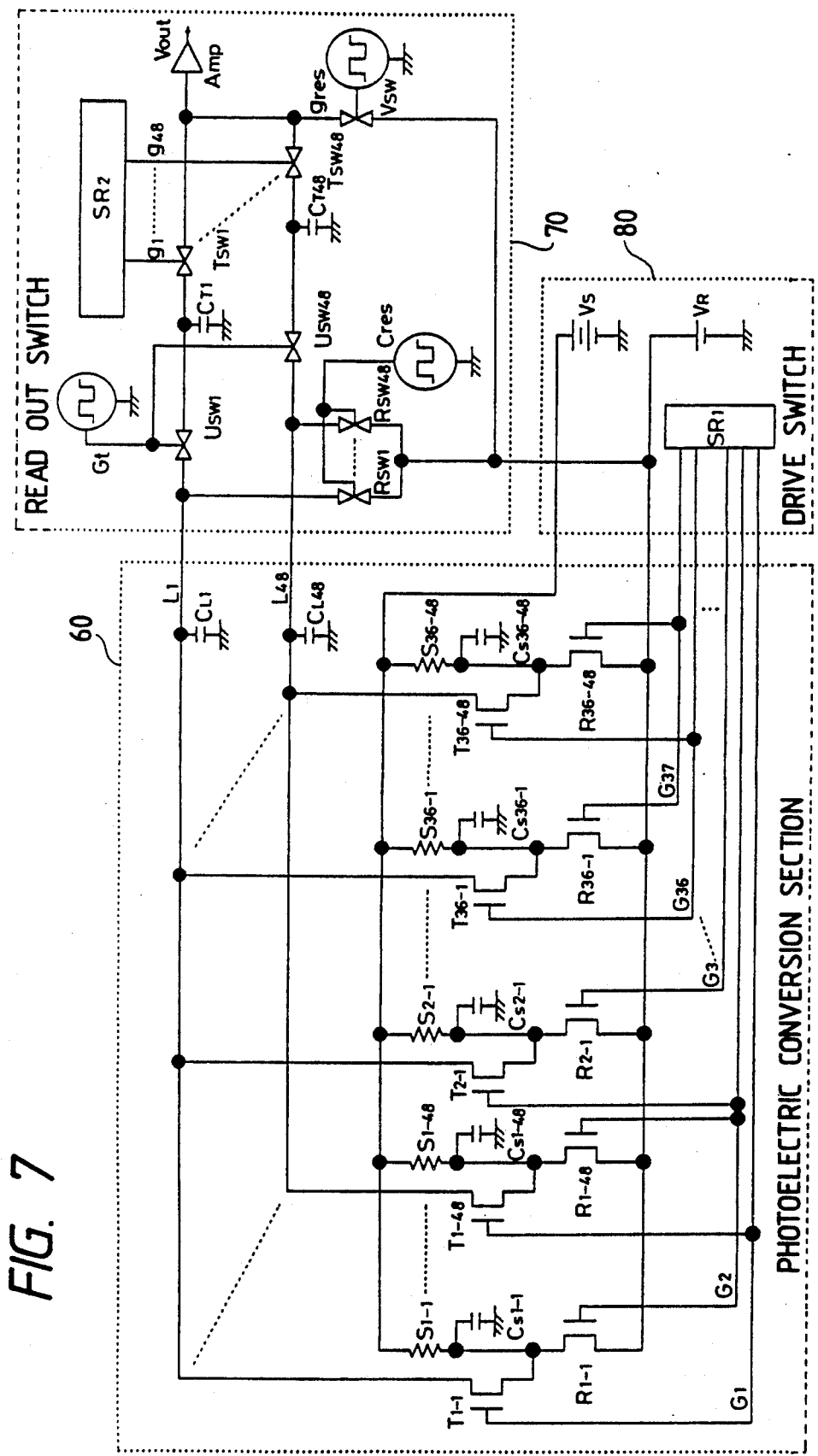
FIG. 7 illustrates an equivalent circuit of the photoelectric conversion apparatus according to the present invention.

FIG. 7 illustrates an equivalent circuit to an embodiment of the photoelectric conversion apparatus according to the present invention. This embodiment is mainly composed of a photoelectric conversion portion, a reading switch IC70 and a drive switch IC80.

Light information made incident upon photoelectric conversion devices $S_{1-1}$ to $S_{36-48}$ is made to be a parallel voltage output after it has traveled from the photoelectric conversion devices $S_{1-1}$ to $S_{36-48}$ through registering capacitors $C_{S1-1}$ to $C_{S36-48}$, $T_1$ to $T_{36-48}$ for the transferring TFT, $R_{1-1}$ to $R_{36-48}$ for the resetting TFT and matrix signal lines $L_1$ to $L_{48}$. Then, it is converted into a series signal by the reading switch IC170 so as to be transmitted outside.

The structure of this embodiment of the photoelectric conversion apparatus according to the present invention is arranged in such a manner that the photoelectric conversion devices the total number of pixels of which is 1728 bits are divided into 36 blocks each of which is composed of 48 bits. The operation of each of the blocks proceeds sequentially.

Optical information made incident upon the photoelectric conversion devices $S_{1-1}$ to $S_{1-48}$ in the first block is converted into an optical current before it is registered as a charge in the registering capacitors $C_{S1-1}$ to $C_{S1-48}$. After a predetermined time has passed, a first transferring-voltage pulse is applied to a gate drive line $G_1$ so as to turn on the $T_{1-1}$ to $T_{1-48}$ for the transferring TFT. As a result, the charges in the registering capacitors $C_{S1-1}$ to $C_{S1-48}$ pass through the matrix signal lines $L_1$ to $L_{48}$ so as to be transferred to load capacitors $C_{L1}$ to $C_{L48}$.

Then, the charges stored in the load capacitors $C_{L1}$ to $C_{L48}$ simultaneously drive transferring switches $U_{SW1}$ to $U_{SW48}$ by transferring pulse $G_t$ so as to be transferred to reading capacitors $C_{T1}$ to $C_{T48}$.

Then, voltage pulses are sequentially added to gate drive lines $g_1$ to $g_{48}$ from a shift register $SR_2$. As a result, the signal charges in the first block transferred to the reading capacitors $C_{T1}$ to $C_{T48}$ are converted into series signals by reading switches $T_{SW1}$ to $T_{SW48}$ before they are amplified by amplifier Amp. Then, they are transmitted outside the photoelectric conversion apparatus as output voltage $V_{out}$.

Then, reset pulse $g_{res}$ is successively applied to reset switch $V_{SW}$ so that the reading switch $T_{SW}$ and reset switch $V_{SW}$ are simultaneously switched on. On the other hand, the reading capacitors $C_{T1}$ to $C_{T48}$ are successively reset to reset voltage level $V_R$.

Furthermore, resetting voltage pulse $C_{res}$ is applied to the reset switches $R_{SW1}$ to $R_{SW48}$ so as to reset the load capacitors CL1 to CL48 to be reset. Then, the voltage pulse is applied to the gate drive line $G_2$ so that the transferring operation of the second block is commenced. Simultaneously, $R_{1-1}$ to $R_{1-48}$ of the resetting TFT are turned on so as to reset the charges in the registering capacitors $C_{S1-1}$ to $C_{S1-48}$ of the first block, causing a preparation for the ensuing reading operation to be made.

Then, the gate drive lines $G_3$ are sequentially driven so that data for one line is transmitted.

The photoelectric conversion apparatus thusconstituted can be adapted to constitute a variety of information processing apparatuses such as a facsimile machine, an image reader, a digital copying machine and an electronic black board.

FIG. 8 illustrates an example of a facsimile machine constituted by using the photoelectric conversion apparatus according to the present invention. Referring to FIG. 8, reference numeral 102 represents feeding rollers for feeding an original document P toward the reading position. Reference numeral 104 represents a separation member for assuredly separating and feeding the original document P one by one. Reference numeral 106 represents platen rollers disposed at the reading position at which the photoelectric conversion apparatus acts, the platen rollers 106 acting to restrict the surface of the original document P to be read and to convey the original document P.

Symbol W represents a recording medium formed into a paper roll on which image information read by the photoelectric conversion apparatus or that transmitted from outside is formed as an image so as to be recorded on the surface thereof. Reference numeral 110 represents a recording head for forming the image which may comprise variously, for example, a thermal head, an ink jet recording head and the like. The recording head may be either the serial type or line type recording head. An ink jet recording head of the type disclosed in U.S. Pat. No. 4,723,129 or that disclosed in U.S. Pat. No. 4,740,796 can be preferably used which is constituted in such a manner that ink is discharged by utilizing thermal energy to record information. The reason for this lies in that the size of the information processing apparatus can further be reduced and the quality of the image can be improved. Reference numeral 112 represents platen rollers for conveying the recording medium W to the position at which recording is performed by the recording head 110 while restricting the surface to be recorded.

Reference numeral 120 represents an operation panel on which switches for inputting the operational inputs, display portions for informing a user messages, and states of the apparatus and the like are formed.

Reference numeral 130 represents a system control substrate on which a control portion for controlling each of the units, a circuit portion for processing image information, a transmitting/receiving portion and the like are formed. Reference numeral 140 represents a power supply for the apparatus.

By using the photoelectric conversion apparatus according to the present invention is used as the image input portion for the system such as a facsimile machine, the image processing operation performed in the system can be easily performed, causing the overall cost of the system to be significantly reduced.

As described above, according to the present invention, there is provided the photoelectric conversion apparatus having, on a light transmissive substrate, a plurality of photoelectric conversion devices and a plurality of light transmissive protection layers formed on the plurality of photoelectric conversion devices and arranged in such a manner that an original document is disposed on the light transmissive protection layers on the side opposing the side which confronts the photoelectric conversion devices, light is emitted from a light source confronting the light transmissive substrate on the side opposing through the original document, transmitted the light transmissible substrate and applied to the original document and reflected light from the original document is received by the plurality of photoelectric conversion devices, the photoelectric conversion apparatus comprising an improvement in that: the light transmissive protection layer is formed by sequentially laminating a protection layer made of an inorganic thin film, a shock absorbing layer made of an organic film and, via an adhesive layer, a wear resisting layer made of thin plate glass. Therefore, the overall cost of the photoelectric conversion apparatus can further be reduced.

Furthermore, according to the present invention, there is provided a photoelectric conversion apparatus having, on a light transmissive substrate, a plurality of photoelectric conversion devices, a drive circuit for driving the photoelectric conversion devices and signal lines for reading out electric signals transmitted from the photoelectric conversion devices and arranged in such a manner that a wear resisting layer made of thin plate glass is formed on the photoelectric conversion devices, the drive circuit and the signal lines, an original document is disposed on the wear resisting layer to confront the photoelectric conversion devices, light is emitted from a light source which is disposed to confront the light transmissive substrate on the side opposing the original document, transmitted through the light transmissible substrate and applied to the original document and reflected light from the original document is received by the photoelectric conversion devices so that electric signals transmitted from the photoelectric conversion devices can be read out through the signal lines, the photoelectric conversion apparatus comprising: a protection layer made of an inorganic thin film and formed on at least the photoelectric conversion devices, the drive circuit and the signal lines; and a shock absorbing layer made of an organic film and disposed at least between an end portion of the wear resisting layer and the light transmissive substrate. Therefore, the overall cost of the photoelectric conversion apparatus can further be reduced.

According to the present invention, the photoelectric conversion apparatus is constituted in such a manner that a passivation layer made of an inorganic thin film material such as a silicon nitride film, a silicone oxide film or a silicon nitrogen oxide film is formed on the semiconductor layer such as a photoelectric conversion device, a shock absorbing layer made of an organic film made of a polyimide resin, a silicone resin or a polyamide resin is formed on the passivation layer and, on the shock absorbing layer, a wear resisting layer made of thin plate glass is attached via an adhesive layer. As a result, a load acting on the inorganic thin film passivation layer at the time of attaching the thin plate glass to the photoelectric conversion devices can be reduced, thereby the inorganic thin film passivation layer can be protected from a damage and the moisture resistance of the photoelectric conversion apparatus can be satisfactorily maintained.

Furthermore, according to the present invention, the passivation layer made of an inorganic thin film can be protected from a damage and thereby the sub-scanning directional width of the light transmissive substrate, which constitutes the photoelectric conversion device portion, can be reduced. As a result, the overall cost of the photoelectric conversion apparatus can further be reduced.

Furthermore, according to the present invention, the photoelectric conversion apparatus is constituted in such a manner that a passivation layer made of an inorganic thin film material such as a silicon nitride film, a silicone oxide film or a silicon nitrogen oxide film is formed on the conductive layer such as a drive circuit and signal lines as well as the semiconductor layer such as a photoelectric conversion device, a shock absorbing layer made of an organic film made of a polyimide resin, a silicone resin or a polyamide resin is formed between an end portion of a wear resisting layer made of thin plate glass and the drive circuit or the signal lines. As a result, a load acting on the inorganic thin film passivation layer at the time of affixing the thin plate glass to the photoelectric conversion devices can be reduced, thereby the inorganic thin film passivation layer can be protected from a damage and the moisture resistance of the photoelectric conversion apparatus can be satisfactorily maintained.

Although the invention has been described in its preferred form with a certain degree of particularly, it is understood that the present disclosure of the preferred form has been changed in the details of construction and the combination and arrangement of parts may be resorted to without departing from the spirit and the scope of the invention as hereinafter claimed.

What is claimed is:

1. A photoelectric conversion apparatus comprising on a substrate:
   (a) a plurality of photoelectric conversion devices;
   (b) electrical connections between said photoelectric conversions devices;
   (c) at least one signal line for reading out electric signals transmitted from said photoelectric conversion devices;
   (d) a protective layer of an inorganic thin film provided at least on (i) said photoelectric conversion devices, (ii) said electrical connections and (iii) said at least one signal line;
   (e) a wear-resisting layer of thin plate glass with an area smaller than an area of said substrate, said wear-resisting layer overlying said photoelectric conversion devices and a portion of said electrical connections on said substrate; and
   (f) a shock-absorbing layer of an organic thin film spaced between an end of said wear-resisting layer, and at least at a part of an area between said end and said substrate, wherein said inorganic thin film extends to at least said end of said wear-resisting layer.

2. A photoelectric conversion apparatus comprising on a substrate;
   (a) a plurality of photoelectric conversion devices;
   (b) electrical connections between said photoelectric conversion devices;
   (c) at least one signal line for reading out electrical signals transmitted from said photoelectric conversion devices;
   (d) a light transmissive protective layer comprising a laminate of an inorganic film and a shock-absorbing layer of an organic film, said protective layer overlying (i) said photoelectric conversion devices, (ii) said electrical connection, and (iii) said at least one signal line; and
   (e) a wear-resisting layer of thin plate glass with an area smaller than an area of said substrate, said wear-resisting layer overlying at least (iv) said photoelectric conversion devices, (v) said electrical connections, and (vi) said at least one signal line on said substrate, wherein said organic film is spaced between an end of said wear-resisting layer and at least a part of an area between said end and said substrate, wherein said inorganic film extends to at least said end of said wear-resisting layer.

3. An information processing apparatus including a photoelectric conversion apparatus comprising on a substrate:
   (a) a plurality of photoelectric conversion devices;
   (b) electrical connections between said photoelectric conversions devices;
   (c) at least one signal line for reading out electric signals transmitted from said photoelectric conversion devices;
   (d) a protective layer of an inorganic thin film provided at least on (i) said photoelectric conversion devices, (ii) said electrical connections, and (iii) said at least one signal line;
   (e) a wear-resisting layer of thin plate glass with an area smaller than an area of said substrate, said wear-resisting layer overlying said photoelectric conversion devices and a portion of said electrical connections on said substrate; and
   (f) a shock-absorbing layer of an organic thin film spaced between an end of said wear-resisting layer, and at least at a part of an area between said end and said substrate, wherein said inorganic thin film extends to at least said end of said wear-resisting layer.

4. An information processing apparatus including a photoelectric conversion apparatus comprising on a substrate;
   (a) a plurality of photoelectric conversion devices;
   (b) electrical connections between said photoelectric conversion devices;
   (c) at least one signal line for reading out electrical signals transmitted from said photoelectric conversion devices;
   (d) a light transmissive protective layer comprising a laminate of an inorganic film and a shock-absorbing layer of an organic film, said protective layer overlying (i) said photoelectric conversion devices, (ii) said electrical connection, and (iii) said at least one signal line; and
   (e) a wear-resisting layer of thin plate glass with an area smaller than an area of said substrate, said wear-resisting layer overlying at least (iv) said photoelectric conversion devices, (v) said electrical connections, and (vi) said at least one signal line on said substrate, wherein said organic film is spaced between an end of said wear-resisting layer and at least a part of an area between said end and said substrate, wherein said inorganic film extends to at least said end of said wear-resisting layer.

5. A photoelectric conversion apparatus according to claim 1, wherein said shock-absorbing layer is formed between said end of said wear-resisting layer and said at least one signal line.

6. A photoelectric conversion apparatus according to claim 1, wherein said shock-absorbing layer is an organic resin layer.

7. A photoelectric conversion apparatus according to claim 6, wherein said organic resin is at least a resin selected from a group consisting of a polyimide resin, a silicone resin and a polyamide resin.

8. A photoelectric conversion apparatus according to 1, wherein said inorganic thin film is made of at least a material selected from a group consisting of silicon nitride and silicon nitride oxide.

9. A photoelectric conversion apparatus according to claim 1, wherein said shock-absorbing layer is formed on said inorganic thin film.

10. A photoelectric conversion apparatus according to claim 1, wherein said shock-absorbing layer is formed into an elongated shape.

11. A photoelectric conversion apparatus according to claim 1, wherein said shock-absorbing layer is formed between said at least one signal line and a contact electrode portion for receiving a signal.

12. A photoelectric conversion apparatus according to claim 1, wherein said shock-absorbing layer is formed to correspond to a portion of an end of said wear resisting layer.

13. A photoelectric conversion apparatus according to claim 12, wherein said portion of said end is a region in which no line is formed between said wear-resisting layer and said substrate.

14. A photoelectric conversion apparatus according to claim 2, wherein said shock-absorbing layer is formed to correspond to at least the overall surface of said wear resisting layer.

15. A photoelectric conversion apparatus according to claim 2, wherein said shock-absorbing layer is an organic resin layer.

16. A photoelectric conversion apparatus according to claim 15, wherein said organic resin is at least a resin selected from a polyimide resin, a silicone resin and a polyamide resin.

17. A photoelectric conversion apparatus according to claim 2, wherein said inorganic film is made of at least a material selected from silicon nitride, silicon oxide and silicon nitride oxide.

18. An apparatus according to any one of claims 1–4, wherein said wear-resisting layer is bonded via an adhesive layer.

19. An apparatus according to any one of claims 1–4, wherein said substrate is a light transmissive substrate.

20. An apparatus according to any one of claims 1–4, wherein said electrical connections comprise drive wiring for driving said photoelectric conversion devices and said at least one signal line for reading out electrical signals transmitted from said photoelectric conversion devices.

* * * * *

UNITED STATES PATENT AND TRADEMARK OFFICE
CERTIFICATE OF CORRECTION

PATENT NO. : 5,198,685            Page 1 of 2
DATED : March 30, 1993
INVENTOR(S) : MASASHI KITANI, ET AL.

It is certified that error appears in the above-identified patent and that said Letters Patent is hereby corrected as shown below:

COLUMN 4

Line 32, "silicone" should read --silicon-- and
"silicon," should read --silicon--.

COLUMN 6

Line 57, "silicone" should read --silicon--.
Line 62, "silicone" should read --silicon--.

COLUMN 7

Line 7, "drawings" should read --drawings.--.

COLUMN 10

Line 20, "Also" should read --Also,--.
Line 21, "be" (second occurrence) should read --is--.

COLUMN 17

Line 65, "mitted" should read --mitted through--.

COLUMN 18

Line 68, "silicone" should read --silicon--.

COLUMN 19

Line 48, "substrate;" should read --substrate:--.

UNITED STATES PATENT AND TRADEMARK OFFICE
CERTIFICATE OF CORRECTION

PATENT NO. : 5,198,685
DATED : March 30, 1993
INVENTOR(S) : MASASHI KITANI, ET AL.

It is certified that error appears in the above-identified patent and that said Letters Patent is hereby corrected as shown below:

COLUMN 20

Line 30, "substrate;" should read --substrate:--.

COLUMN 21

Line 13, "wear resist-" should read --wear-resist- --.
Line 22, "wear" should read --wear- --.

Signed and Sealed this

First Day of March, 1994

BRUCE LEHMAN

Attest:

Attesting Officer

Commissioner of Patents and Trademarks